(12) United States Patent
Chang et al.

(10) Patent No.: US 10,770,013 B2
(45) Date of Patent: Sep. 8, 2020

(54) SEMICONDUCTOR SUBSTRATE AND DRIVING METHOD

(71) Applicant: Au Optronics Corporation, Hsinchu (TW)

(72) Inventors: Che-Chia Chang, Hsinchu (TW); Hsien-Chun Wang, Hsinchu (TW); Pin-Miao Liu, Hsinchu County (TW); Ming-Hung Chuang, Tainan (TW); Ming-Hsien Lee, Hsinchu (TW); Shin-Shueh Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/457,934

(22) Filed: Jun. 29, 2019

(65) Prior Publication Data

US 2020/0051518 A1 Feb. 13, 2020

Related U.S. Application Data

(60) Provisional application No. 62/717,260, filed on Aug. 10, 2018.

(30) Foreign Application Priority Data

Feb. 1, 2019 (TW) .............................. 108104020 A

(51) Int. Cl.
*G09G 5/10* (2006.01)
*G09G 3/36* (2006.01)
(Continued)

(52) U.S. Cl.
CPC ......... *G09G 3/3648* (2013.01); *G02F 1/1368* (2013.01); *G02F 1/13624* (2013.01);
(Continued)

(58) Field of Classification Search
CPC ......... G02F 1/136213; G02F 1/136227; G02F 1/13624; G02F 1/136286; G02F 1/1368;
(Continued)

(56) References Cited

U.S. PATENT DOCUMENTS

2011/0285687 A1* 11/2011 Umezaki .............. G09G 3/3677
345/211
2011/0285688 A1* 11/2011 Miyake ................ G09G 3/3614
345/211

FOREIGN PATENT DOCUMENTS

CN 100573281 12/2009
CN 104503713 4/2015
(Continued)

*Primary Examiner* — Insa Sadio
(74) *Attorney, Agent, or Firm* — JCIPRNET

(57) ABSTRACT

A semiconductor substrate including a data line, a scan line, a capacitance control line, a first transistor, a pixel electrode, a second transistor, a storage capacitor and a third transistor is provided. A first terminal of the first transistor is electrically connected to the data line. A control terminal of the first transistor is electrically connected to the scan line. The pixel electrode is electrically connected to a second terminal of the first transistor. A first terminal of the second transistor is electrically connected to the second terminal of the first transistor. A first terminal of the third transistor is electrically connected to the capacitance control line. A control terminal of the third transistor is electrically connected to the scan line, and a second terminal of the third transistor is electrically connected to a control terminal of the second transistor.

21 Claims, 20 Drawing Sheets

(51) Int. Cl.
*G02F 1/1362* (2006.01)
*G02F 1/1368* (2006.01)
*H01L 27/12* (2006.01)

(52) U.S. Cl.
CPC .. *G02F 1/136213* (2013.01); *G02F 1/136227* (2013.01); *G02F 1/136286* (2013.01); *G09G 3/3607* (2013.01); *H01L 27/124* (2013.01); *H01L 27/1255* (2013.01); *G02F 2001/13685* (2013.01); *G09G 2300/0819* (2013.01); *G09G 2320/0247* (2013.01); *G09G 2330/021* (2013.01)

(58) Field of Classification Search
CPC .. G02F 2001/13685; G09G 2300/0819; G09G 2320/0247; G09G 2330/021; G09G 3/3607; G09G 3/3648; H01L 27/1214; H01L 27/124; H01L 27/1255; H01L 27/127; H01L 29/78633
See application file for complete search history.

(56) References Cited

FOREIGN PATENT DOCUMENTS

| | | |
|---|---|---|
| TW | 201113847 | 4/2011 |
| TW | I444980 | 7/2014 |

* cited by examiner

SEMICONDUCTOR SUBSTRATE AND DRIVING METHOD

CROSS-REFERENCE TO RELATED APPLICATION

This application claims the priority benefit of U.S. provisional application Ser. No. 62/717,260, filed on Aug. 10, 2018, and Taiwan application serial no. 108104020, filed on Feb. 1, 2019. The entirety of each of the above-mentioned patent applications is hereby incorporated by reference herein and made a part of this specification.

BACKGROUND

Technical Field

The invention relates to a semiconductor substrate and a driving method.

Description of Related Art

With the development of display technology, display panels have been widely used in daily life. Taking the application in a mobile electronic device (such as a mobile phone, a watch, a tablet PC, a notebook computer, etc.) as an example, one of the important characteristics of the display panel is power consumption. If the power consumption of the display panel is low, that is, the display panel saves power, then it helps to extend the use time of the mobile electronic device.

In the conventional art, in order to reduce the power consumption of the display panel, a frame rate of a display image can be lowered to, for example, 30 Hz or 15 Hz. However, when the frame rate is low, a leakage current of a pixel structure of the display panel is high, and a flickering problem occurs under a specific grayscale image. In order to ameliorate the flickering problem, storage capacitors in the pixel structure of the display panel can be increased. However, when the storage capacitors are increased, a charging rate of the pixel structure may be insufficient, which affects the display quality. In addition, the increase in the storage capacitors also makes the display panel more power hungry.

SUMMARY

The invention provides a semiconductor substrate, with which a display panel having good display quality and saving power can be achieved.

The invention provides a driving method, wherein a semiconductor substrate adopting this driving method to drive a display panel can reduce power consumption of the display panel while maintaining display quality.

The semiconductor substrate of the invention includes a base, a data line, a scan line, a capacitance control line, a first transistor, a pixel electrode, a second transistor, a storage capacitor, and a third transistor. The data line, the scan line and the capacitance control line are disposed on the base. A first terminal of the first transistor is electrically connected to the data line. A control terminal of the first transistor is electrically connected to the scan line. The pixel electrode is electrically connected to a second terminal of the first transistor. A first terminal of the second transistor is electrically connected to the second terminal of the first transistor. The storage capacitor is electrically connected to a second terminal of the second transistor. A first terminal of the third transistor is electrically connected to the capacitance control line. A control terminal of the third transistor is electrically connected to the scan line. A second terminal of the third transistor is electrically connected to a control terminal of the second transistor.

In an embodiment of the invention, a vertical projection of the second transistor on the base is located between a vertical projection of the first transistor on the base and a vertical projection of the third transistor on the base.

In an embodiment of the invention, a vertical projection of the second transistor on the base is located between a vertical projection of the scan line on the base and a vertical projection of the storage capacitor on the base.

In an embodiment of the invention, the data line extends in a first direction, the scan line extends in a second direction, the control terminal of the second transistor extends in a third direction, and the third direction is intersected with the first direction and the second direction.

In an embodiment of the invention, the second direction and the third direction have an included angle $\theta$, and $0°<\theta<60°$.

In an embodiment of the invention, the second transistor includes a semiconductor pattern extending in a fourth direction, and the third direction is intersected with the first direction, the second direction and the fourth direction.

In an embodiment of the invention, the second direction and the fourth direction have an included angle $\Phi$, and $0°<\Phi<60°$.

In an embodiment of the invention, the third direction and the fourth direction have an included angle $\alpha$, and $0°\leq\alpha\leq90°$.

In an embodiment of the invention, the storage capacitor includes an insulating layer and a conductive pattern. The insulating layer is disposed on the second terminal of the second transistor. The pixel electrode is disposed on the insulating layer. The conductive pattern is disposed on the insulating layer. The conductive pattern is separated from the pixel electrode. The conductive pattern is electrically connected to the second terminal of the second transistor via a contact window of the insulating layer, wherein the conductive pattern overlaps with the second terminal of the second transistor.

In an embodiment of the invention, the semiconductor substrate further includes a common electrode disposed on the base. The common electrode overlaps with the pixel electrode to form a display medium capacitor. A capacitance value of the storage capacitor is greater than half of a capacitance value of the display medium capacitor.

In an embodiment of the invention, a semiconductor pattern of the first transistor has a channel width to length ratio $$\frac{W1}{L1},$$

a semiconductor pattern of the second transistor has a channel width to length ratio $$\frac{W2}{L2}, \text{ and } \frac{W2}{L2} > \frac{W1}{L1}.$$

In an embodiment of the invention, a semiconductor pattern of the third transistor has a channel width to length ratio $\frac{W3}{L3}$, and $\frac{W3}{L3} < \left(\frac{W1}{L1}\right) / \left(\frac{W2}{L2}\right)$.

A driving method of the invention is configured to drive a semiconductor substrate. The semiconductor substrate includes a plurality of pixel structures, and each of pixel structures includes a data line, a scan line, a capacitance control line, a first transistor, a pixel electrode, a second transistor, and a storage capacitor, wherein a first terminal of the first transistor is electrically connected to the data line, a control terminal of the first transistor is electrically connected to the scan line, a second terminal of the first transistor is electrically connected to the pixel electrode, a first terminal of the second transistor is electrically connected to the second terminal of the first transistor, a control terminal of the second transistor is electrically connected to the capacitance control line, and a second terminal of the second transistor is electrically connected to the storage capacitor. The driving method includes: determining an ON or OFF of at least one second transistor of at least one of the pixel structures according to at least one data signal of at least one data line of the at least one of the pixel structures.

In an embodiment of the invention, the step of determining the ON or OFF of the at least one second transistor of the at least one of the pixel structures according to the at least one data signal of the at least one data line of the at least one of the pixel structures includes: enabling the at least one second transistor of the at least one of the pixel structures to be turned ON when determining that a grayscale value of the at least one data signal of the at least one data line of the at least one of the pixel structures is between a first preset value and a second preset value, wherein the first preset value is smaller than the second preset value.

In an embodiment of the invention, the step of determining the ON or OFF of the at least one second transistor of the at least one of the pixel structures according to the at least one data signal of the at least one data line of the at least one of the pixel structures: enabling the at least one second transistor of the at least one of the pixel structures to be turned OFF when determining that a grayscale value of the at least one data signal of the at least one data line of the at least one of the pixel structures is smaller than a first preset value.

In an embodiment of the invention, the step of determining the ON or OFF of the at least one second transistor of the at least one of the pixel structures according to the at least one data signal of the at least one data line of the at least one of the pixel structures: enabling the at least one second transistor of the at least one of the pixel structures to be turned OFF when determining that a grayscale value of the at least one data signal of the at least one data line of the at least one of the pixel structures is greater than a second preset value.

In an embodiment of the present invention, the pixel structures are configured to display a plurality of images, and the driving method further includes: determining the ON or OFF of the second transistors of the pixel structures according to a plurality of characteristics of the images.

In an embodiment of the invention, the images include a first image and a second image, and the pixel structures include a plurality of first pixel structures for displaying the first image and a plurality of second pixel structures for displaying the second image, and the steps of determining the ON or OFF of the second transistors of the pixel structures according to the characteristics of the images include: d enabling a plurality of second transistors of the first pixel structures to be turned OFF when determining that the first image comprises a gray screen and a white character interspersed in the gray screen; and enabling a plurality of second transistors of the second pixel structures to be turned ON when determining that the second image comprises a full gray screen.

In an embodiment of the invention, the step of determining the ON or OFF of the second transistors of the pixel structures according to the characteristics of the images includes: determining the ON or OFF of the second transistors of the pixel structures according to a plurality of frame rates of the images.

In an embodiment of the invention, the images include a first image and a second image, and the pixel structures include a plurality of first pixel structures for displaying the first image and a plurality of second pixel structures for displaying the second image, and the steps of determining the ON or OFF of the second transistors of the pixel structures according to the frame rates of the images include: enabling a plurality of second transistors of the first pixel structures to be turned ON when determining that a frame rate of the first image is equal to or lower than a first preset frequency; and enabling a plurality of second transistors of the second pixel structures to be turned OFF when determining that a frame rate of the of the second image is equal to or higher than a second preset frequency, wherein the first preset frequency is higher than the second preset frequency.

In an embodiment of the present invention, each of a plurality of data signals of the data lines of the pixel structures ranges between a high data potential Vdh and a low data potential Vdl, each of a plurality of scanning signals of the scan lines of the pixel structures ranges between a high scan potential Vgh and a low scan potential Vgl, each of a plurality of control signals of the capacitance control lines of the pixel structures ranges between a high control potential Vch and a low control potential Vcl, Vdh<Vch<Vgh, and Vgl<Vcl<Vdl.

In view of the above, in an embodiment of the invention, whether the second transistors are to be turned ON to charge the storage capacitors may be determined according to a grayscale value to be displayed and/or a frame rate of an image to be displayed. As such, the display panel adopting the semiconductor substrate according to an embodiment of the invention is able to ameliorate the flickering problem while achieving the power saving effect.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
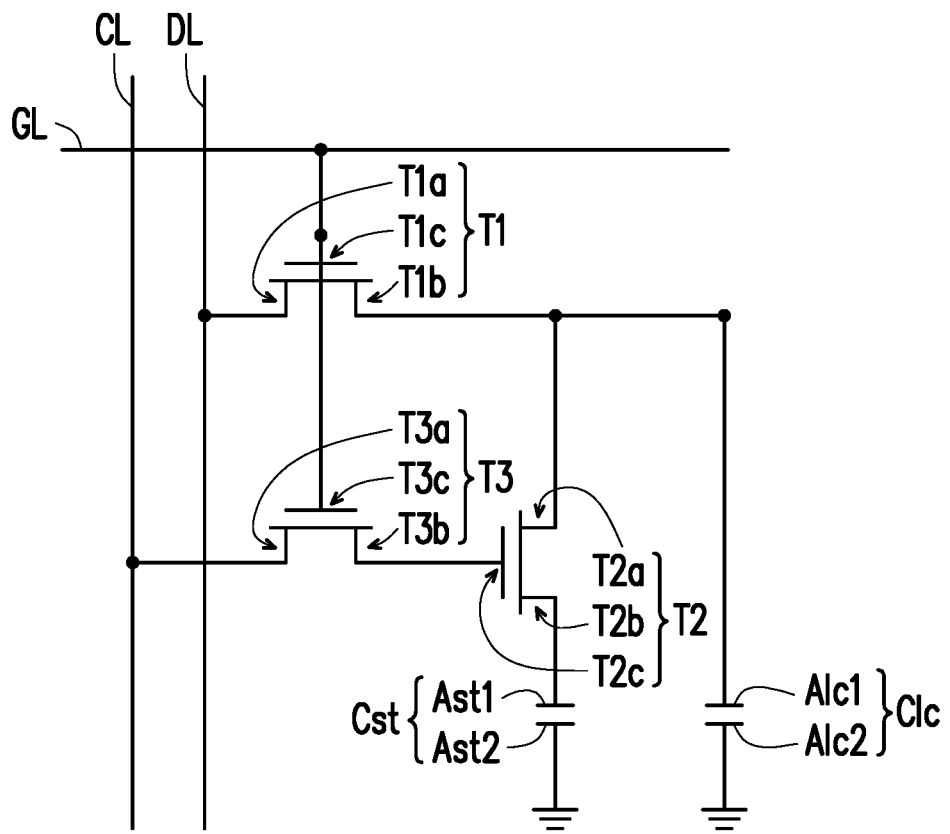
FIG. 1 is a schematic diagram of a pixel structure PX according to a first embodiment of the invention.

In the drawings, for clarity, the thickness of layers, films, plates, area, and so on are magnified. Throughout the specification, the same reference numerals indicate the same elements. It should be understood that when an element such as a layer, a film, an area, or a substrate is indicated to be "on" another element or "connected to" another element, it may be directly on another element or connected to another element, or an element in the middle may be existed. In contrast, when an element is indicated to be "directly on another element" or "directly connected to" another element, an element in the middle is not existed. For example, "connect" indicated in the specification may indicate physically and/or electrically connect. Furthermore, "electrically connect" or "coupled to" may be indicated that other element exists between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may be indicated that within one or more standard deviations of the value, or within ±30%, ±20%, ±10%, ±5%. Furthermore, the usages of "approximately", "similar to" or "substantially" indicated throughout the specification may be referred to a more acceptable deviation scope or standard deviation depending on optical properties, etching properties, or other properties, and all properties may not be applied with one standard deviation.

Unless otherwise defined, the terms used throughout the specification (including both technical and scientific terms) has the same meaning understood by people skilled in the art. It should be further understood that, terms such as those defined in commonly used dictionaries should be interpreted as having meanings consistent with the meanings in the prior art and the context of the invention, and shall not be interpreted as an idealized or overly formal meaning, unless they are definitely defined in the content.

Exemplary embodiments are described herein with reference to cross section illustrations that are schematic illustrations of idealized embodiments. Therefore, variations in the shapes of the illustrations of, for example, the result of manufacturing techniques and/or tolerances, are to be expected. Thus, embodiments described herein should not be interpreted as a certain shape limited to areas illustrated in the context, but are to include deviations in shapes that result, for example, from manufacturing. For instance, illustrated or described flat areas may usually have rough and/or non-linear features. Besides, the illustrated acute angle may be round. Therefore, areas illustrated in drawing are substantially schematic, their shapes are not intended to illustrate the exact shapes of the areas, and they are not intended to limit the claimed scopes.

References of the exemplary embodiments of the invention are made in detail. Examples of the exemplary embodiments are illustrated in the drawings. If possible, the same reference numerals in the drawings and the descriptions are indicated the same or similar parts.

FIG. 1 is a schematic diagram of a pixel structure PX according to a first embodiment of the invention. Referring to FIG. 1, the pixel structure PX includes a data line DL, a scan line GL, a capacitance control line CL, a first transistor T1, a second transistor T2, a display medium capacitor Clc, and a storage capacitor Cst. The first transistor T1 has a first terminal T1a, a control terminal T1c and a second terminal T1b. The second transistor T2 has a first terminal T2a, a control terminal T2c and a second terminal T2b. The first terminal T1a of the first transistor T1 is electrically connected to the data line DL. The control terminal T1c of the first transistor T1 is electrically connected to the scan line GL. The second terminal T1b of the first transistor T1 is electrically connected to an electrode Alc1 of the display medium capacitor Clc. Another electrode Alc2 of the display medium capacitor Clc is electrically connected to a reference potential, wherein the reference potential may be a ground potential, a fixed potential or an adjustable potential. The first terminal T2a of the second transistor T2 is electrically connected to the second terminal T1b of the first transistor T1. The control terminal T2c of the second transistor T2 is electrically connected to the capacitance control line CL. The second terminal T2b of the second transistor T2 is electrically connected to an electrode Ast1 of the storage capacitor Cst. Another electrode Ast2 of the storage capacitor Cst is electrically connected to a reference potential, wherein the reference potential may be a ground potential, a fixed potential or an adjustable potential. In the present embodiment, the pixel structure PX further includes a third transistor T3. A first terminal T3a of the third transistor T3 is electrically connected to the capacitance control line CL. A control terminal T3c of the third transistor T3 is electrically connected to the scan line GL. A second terminal T3b of the third transistor T3 is electrically connected to the control terminal T2c of the second transistor T2.

Figure 2:
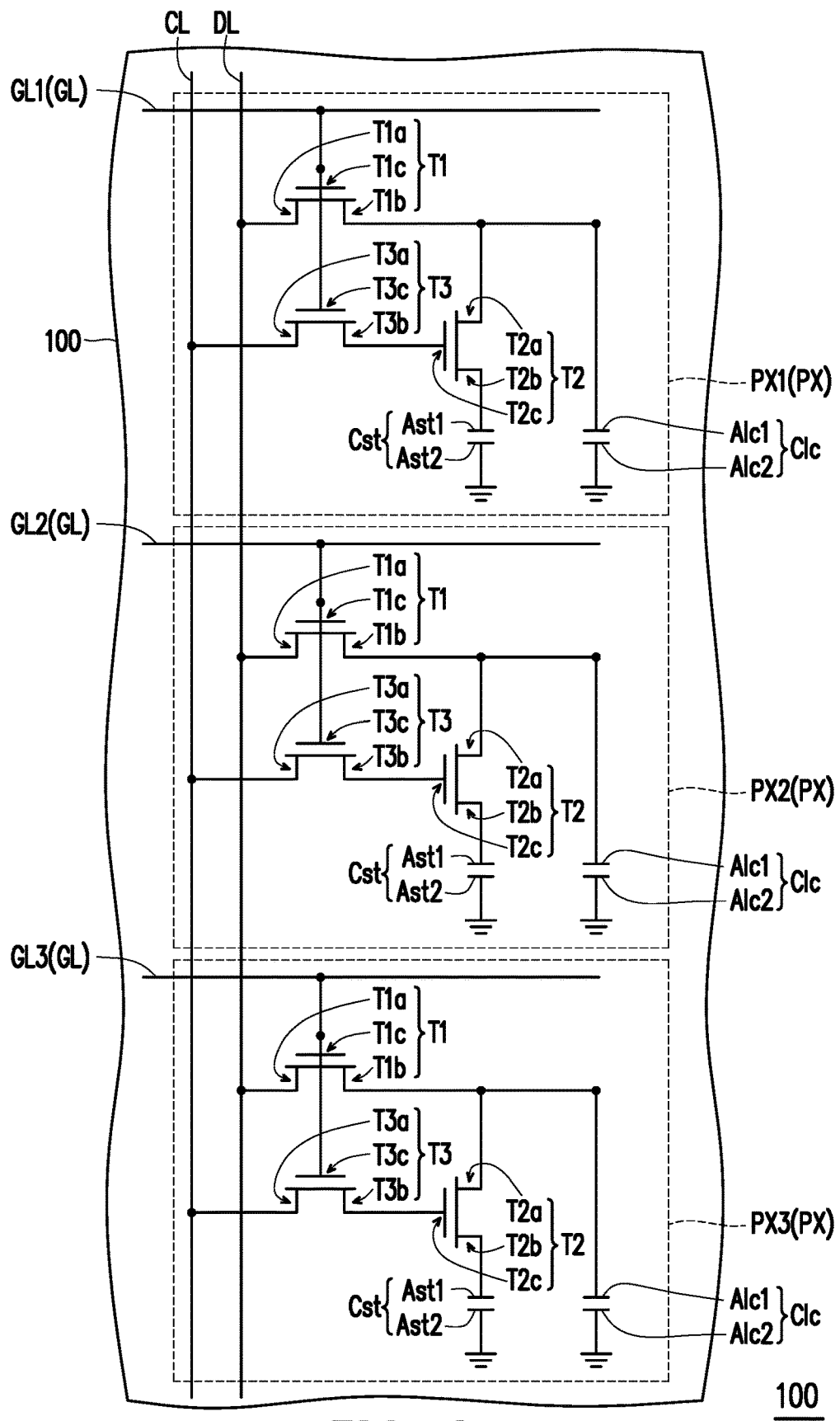
FIG. 2 is a schematic top diagram of a semiconductor substrate according to the first embodiment of the invention.

FIG. 2 is a schematic top diagram of a semiconductor substrate according to the first embodiment of the invention. Referring to FIG. 2, the semiconductor substrate 100 includes a base 110 and a plurality of pixel structures PX disposed on the base 110. The data lines DL of a part of pixel structures PX1, PX2, PX3 of the semiconductor substrate 100 may be connected to each other. The capacitance control lines CL of the part of pixel structures PX1, PX2, PX3 of the semiconductor substrate 100 may be connected to each other. The scanning lines GL1, GL2, GL3 of the part of pixel structures PX1, PX2, PX3 of the semiconductor substrate 100 may be separated from each other and sequentially arranged.

Figure 3:
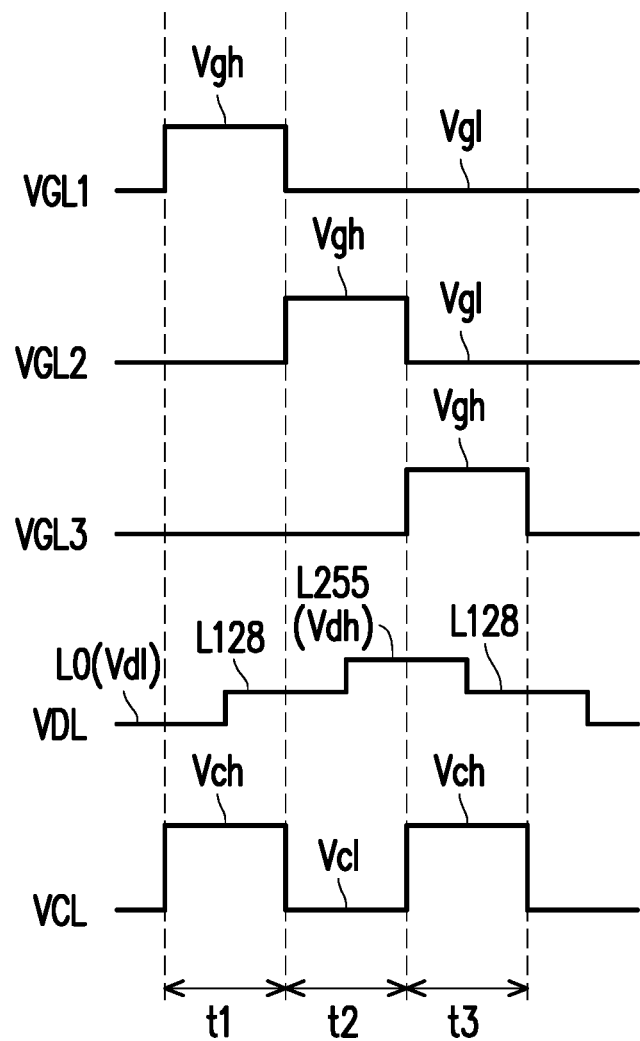
FIG. 3 illustrates a scanning signal VGL1, a scanning signal VGL2, a scanning signal VGL3, a data signal VDL, and a control signal VCL respectively having by a scan line GL1, a scan line GL2, a scan line GL3, a data line DL, and a capacitance control line CL of FIG. 2 in each of time intervals t1, t2 and t3.

FIG. 3 illustrates a scanning signal VGL1, a scanning signal VGL2, a scanning signal VGL3, a data signal VDL, and a control signal VCL respectively having by the scan line GL1, the scan line GL2, the scan line GL3, the data line DL, and the capacitance control line CL of FIG. 2 in each of time intervals t1, t2 and t3.

Figure 4:
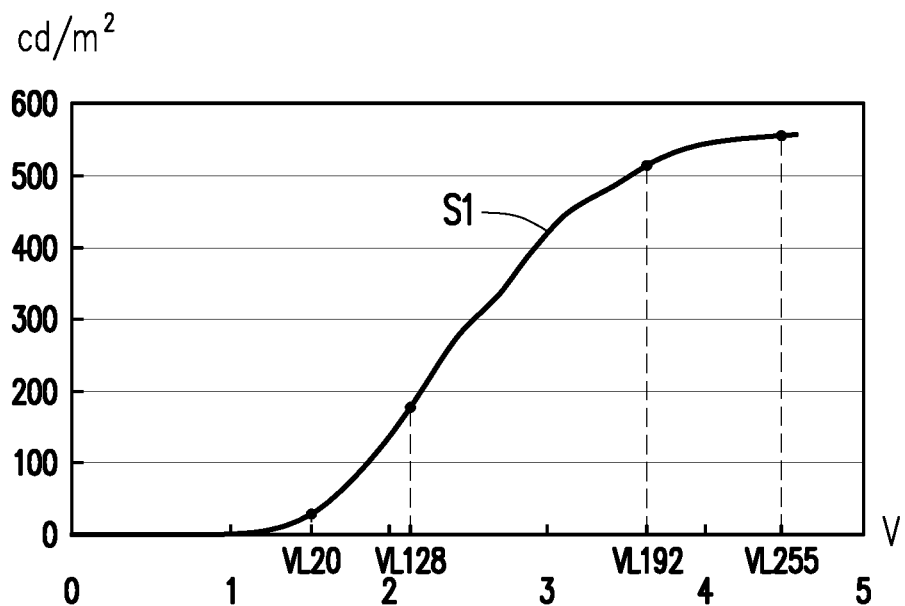
FIG. 4 shows a relationship curve S1 for a root mean square (RMS) voltage value (V) of the data signal VDL of pixel structures PX and a brightness (cd/m²) of the pixel structure PX according to the first embodiment of the invention.
Figure 5:
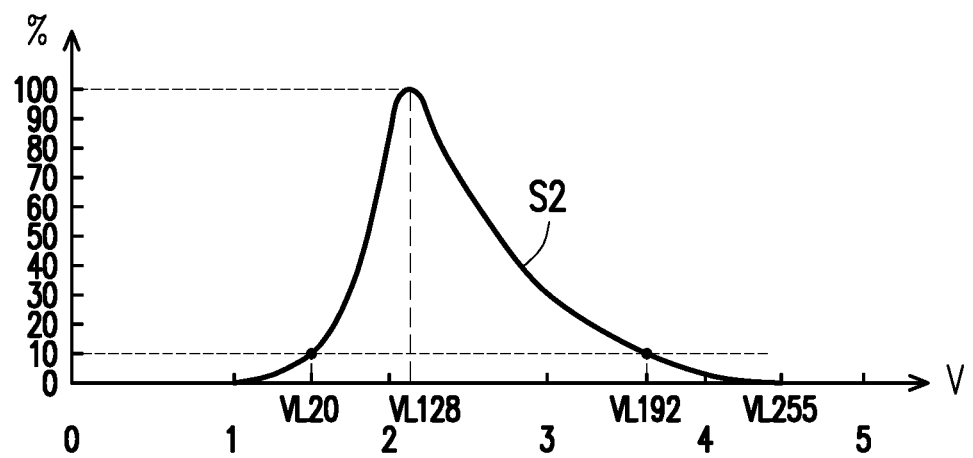
FIG. 5 shows a relationship curve S2 for the RMS voltage value (V) of the data signal VDL of pixel structures PX and the brightness of the pixel structure PX vs. a normalized change rate of the RMS voltage value (V) of the data signal VDL according to the first embodiment of the invention.

FIG. 4 shows a relationship curve S1 for a root mean square (RMS) voltage value (V) of the data signal VDL of pixel structures PX and a brightness (cd/m$^2$) of the pixel structure PX according to the first embodiment of the invention. FIG. 5 shows a relationship curve S2 for the RMS voltage value (V) of the data signal VDL of pixel structures PX and the brightness of the pixel structure PX vs. a normalized change rate of the RMS voltage value (V) of the data signal VDL according to the first embodiment of the invention. By differentiating the relationship curve S1 of FIG. 4, the relationship curve S2 of FIG. 5 can be obtained.

In the present embodiment, an ON or OFF of the second transistor T2 can be selectively determined according to the data signal VDL of the data line DL of each pixel structure PX, thereby controlling whether to charge the storage capacitor Cst. Examples are illustrated as follows in reference to FIG. 2 to FIG. 5.

Referring to FIG. 2 and FIG. 3, in the present embodiment, during the first time interval t1, the scanning signal VGL1 of the scanning line GL1 of the pixel structure PX1 has a high scanning potential Vgh, and the data signal VDL of the data line DL of the pixel structure PX1 is switched from a grayscale value L0 to a grayscale value L128. The RMS voltage value of the data signal VDL corresponding to the grayscale value L128 is VL128 (as shown in FIG. 4). When it is determined that the grayscale value L128 is between a first preset value and a second preset value, the control signal VCL of the capacitance control line CL of the pixel structure PX1 is enabled to have a high control potential Vch, wherein the first preset value is smaller than the second preset value. At this time, the first transistor T1, the second transistor T2 and the third transistor T3 of the pixel structure PX1 are all turned ON, and the storage capacitor Cst and the display medium capacitor Clc of the pixel structure PX1 are to be charged. In this way, even if the pixel structure PX1 has a leakage current during a process in which the pixel structure PX1 is used for displaying an image, the leakage current accounts for a small proportion of a total amount of charge originally stored in the storage capacitor Cst and the display medium capacitor Clc of the pixel structure PX1, and therefore, the leakage current does not cause an excessive voltage drop in the display medium capacitor Clc. Accordingly, even if the pixel structure PX1 is operated at the grayscale value L128 and the brightness of the pixel structure PX1 is sensitive to a voltage change near the RMS voltage value VL128 (as shown in FIG. 4) (or rather, a tangent slope of the relationship curve S1 at the RMS voltage value VL128 is large), a degree of flicker in the display panel adopting the pixel structure PX1 is still slight and conforms to product specifications.

In short, when the grayscale value L128 of the pixel structure PX1 is between the first preset value and the second preset value, the second transistor T2 of the pixel structure PX1 is enabled to be turned ON, so as to charge the capacitor Cst. As such, an influence of the leakage current of the pixel structure PX1 on the brightness of the pixel structure PX1 can be reduced, thereby ameliorating and the flickering problem of the display panel adopting the pixel structure PX1. Examples are illustrated in the following, with reference to FIG. 4 and FIG. 5, for describing how to select the first preset value and the second preset value.

Referring to FIG. 4 and FIG. 5, the relationship curve S2 has a maximum normalized change rate of 100%, and the relationship curve S2 has 10% of the maximum normalized change rate of 100% at a RMS voltage value VL20 and a RMS voltage value VL192, respectively. In the present embodiment, the first preset value and the second preset value may be a grayscale value L20 and a grayscale value L192 respectively corresponding to the RMS voltage value VL20 and the RMS voltage value VL192. However, the invention is not limited thereto. In other embodiments, the first preset value and the second preset value may also be set in other manners.

Referring again to FIG. 2 and FIG. 3, in the second time interval t2 following the first time interval t1, the scanning signal VGL2 of the scanning line GL2 of the pixel structure PX2 has a high scanning potential Vgh, and the data signal VDL of the data line DL of the pixel structure PX2 is switched from the grayscale value L128 to a grayscale value L255. A RMS voltage value of the data signal VDL corresponding to the grayscale value L255 is VL255 (as shown in FIG. 4). When it is determined that the grayscale value L255 is greater than the second preset value or the grayscale value L255 is smaller than the first preset value, the control signal VCL of the capacitance control line CL of the pixel structure PX2 is enabled to have a low control potential Vcl. At this time, the first transistor T1 and the third transistor T3 of the pixel structure PX2 are turned ON, the second transistor T2 of the pixel structure PX2 is turned OFF, the display medium capacitor Clc of the pixel structure PX2 is to be charged, and the storage capacitor Cst of the pixel structure PX2 is not to be charged. In this way, even if the pixel structure PX2 has a leakage current during a process in which the pixel structure PX2 is used for displaying an image and the leakage current accounts for a large proportion of a total amount of charge originally stored in the display medium capacitance Clc of the pixel structure PX2, because the brightness of the pixel structure PX2 is insensitive to the voltage change near the RMS voltage value VL255 (or rather, the tangent slope of the relationship curve S1 at the RMS voltage value VL255 is small), the leakage current does not cause the brightness of the pixel structure PX2 to change excessively. That is, when the grayscale value L255 is greater than the second preset value or less than the first preset value, even if the second transistor T2 is turned OFF without charging the storage capacitor Cst, a degree of flicker in the display panel of the pixel structure PX2 is still slight and conforms with the product specifications. Further, since it is passable to not charge the storage capacitor Cst of the pixel structure PX2, the display panel adopting the pixel structure PX2 can achieve a power saving effect in the case where the degree of flicker conforms to a specification value.

Referring again to FIG. 2 and FIG. 3, in the third time interval t3 following the second time interval t2, the scanning signal VGL1 of the scanning line GL3 of the pixel structure PX3 has a high scanning potential Vgh, and the data signal VDL of the data line DL of the pixel structure PX3 is switched from the grayscale value L255 to the grayscale value L128. The RMS voltage value of the data signal VDL corresponding to the grayscale value L128 is VL128 (as shown in FIG. 4). When it is determined that the grayscale value L128 is between the first preset value and the second preset value, the control signal VCL of the capacitance control line CL of the pixel structure PX3 is enabled to have a high control potential Vch. At this time, the first transistor T1, the second transistor T2 and the third transistor T3 of the pixel structure PX3 are all turned ON, and the storage capacitor Cst and the display medium capacitor Clc of the pixel structure PX3 are to be charged. In this way, even if the pixel structure PX3 has a leakage current during a process in which the pixel structure PX3 is used for displaying an image, the leakage current accounts a small proportion of a total amount of charge originally stored in the storage capacitor Cst and the display medium capacitor Clc of the pixel structure PX3, and therefore, the leakage current does not cause an excessive voltage drop in the display medium capacitor Clc. Accordingly, even if the pixel structure PX3 is operated at the grayscale value L128 and the brightness of the pixel structure PX3 is sensitive to the voltage change near the RMS voltage value VL128 (or rather, the tangent slop of the relationship curve S1 is at the RMS voltage value VL128 is large), a degree of flicker in the display panel adopting the pixel structure PX3 is still slight and conforms to the product specifications.

In addition, in the present embodiment, each of the data signals VDL of the data lines DL of the pixel structures PX ranges between a high data potential Vdh (for example, but not limited to: grayscale value L255) and a low data potential Vdl (for example, but not limited to: grayscale value L0), each of the scan signals VGL1, VGL2 and VGL3 of the scan lines GL of the pixel structures PX ranges between the high scan potential Vgh and the low scan potential Vgl, and each of the control signals VCL of the capacitance control lines CL of the pixel structures PX ranges between the high control potential Vch and the low control potential Vcl, wherein Vdh<Vch<Vgh, and Vgl<Vcl<Vdl.

Figure 6:
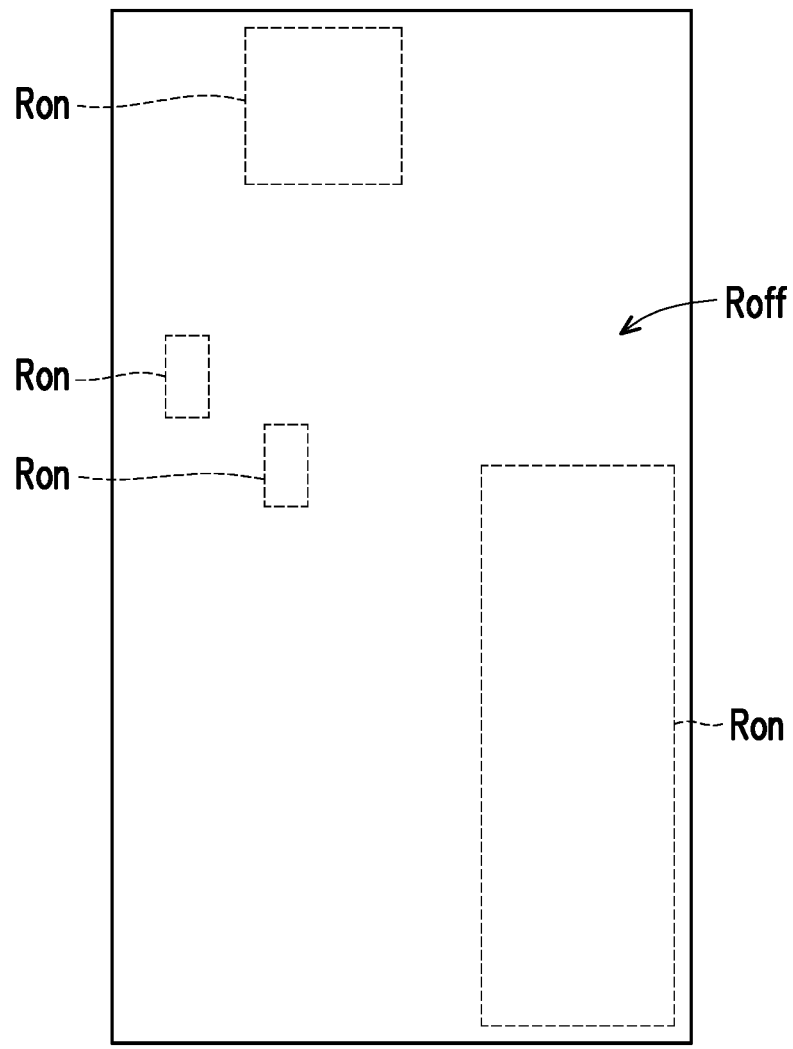
FIG. 6 is a schematic diagram of a display panel according to the first embodiment of the invention.

FIG. 6 is a schematic diagram of a display panel according to the first embodiment of the invention. Referring to FIG. 6, the display panel 10 includes a semiconductor substrate 100 (not shown) having the pixel structure PX described above, an opposite substrate (not shown) opposite to the semiconductor substrate 100, and a display medium (not shown; for example, but not limited to: liquid crystal) disposed between the semiconductor substrate 100 and the opposite substrate. between. The display panel 10 has a plurality of display regions Ron, Roff. In the present embodiment, the ON or OFF of the second transistors T2 respectively located in the display regions Ron, Roff of the pixel structures PX may be determined according to characteristics of an image displayed by each of the display regions Ron, Roff. In the present embodiment, the ON or OFF of the second transistor T2 of each pixel structure PX can be determined by the scanning signal VGL of the scanning line GL and the control signal VCL of the capacitance control line CL of each pixel structure PX. That is to say, in the present embodiment, whether or not to turn ON the second transistor T2 of each pixel structure PX can be individually determined, and the display region Ron in which the second transistor T2 is turned ON and the display region Roff in which the second transistor T2 is turned OFF can be located in a same row or in different rows, depending on actual needs.

Figure 7:
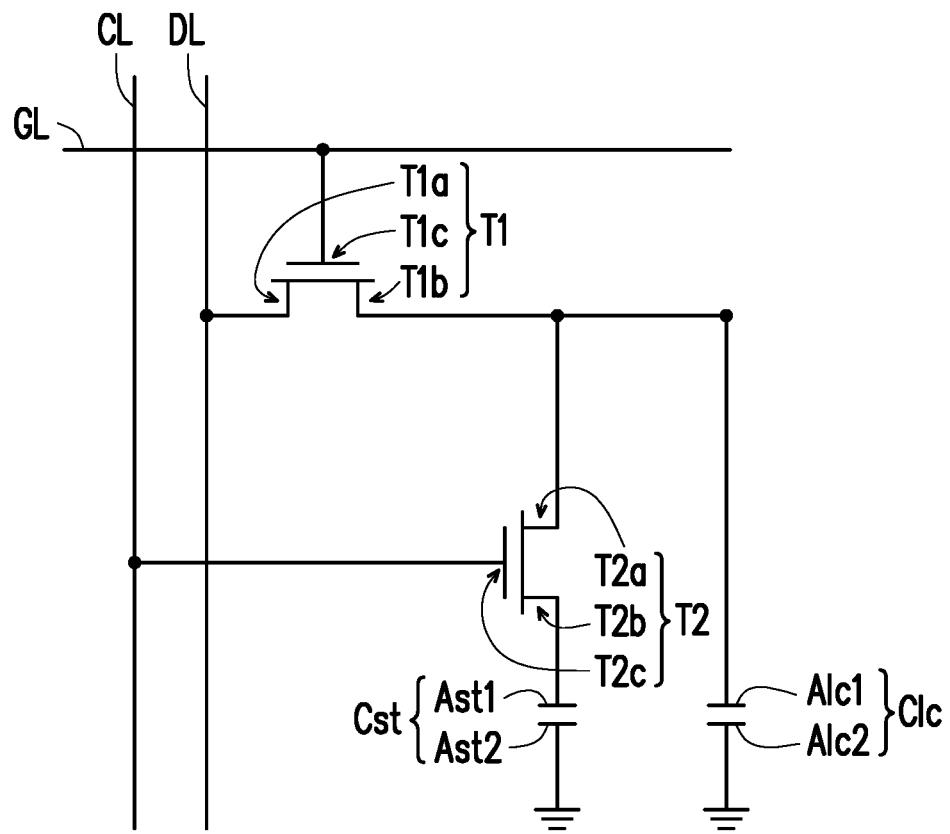
FIG. 7 is a schematic diagram of a pixel structure PX' according to a second embodiment of the invention.

FIG. 7 is a schematic diagram of a pixel structure PX' according to a second embodiment of the invention. Referring to FIG. 7, the pixel structure PX' includes a data line DL, a scan line GL, a capacitance control line CL, a first transistor T1, a second transistor T2, a display medium capacitor Clc, and a storage capacitor Cst. The first transistor T1 has a first terminal T1a, a control terminal T1c and a second terminal T1b. The second transistor T2 has a first terminal T2a, a control terminal T2c and a second terminal T2b. The first terminal T1a of the first transistor T1 is electrically connected to the data line DL. The control terminal T1c of the first transistor T1 is electrically connected to the scan line GL. The second terminal T1b of the first transistor T1 is electrically connected to an electrode Alc1 of the display medium capacitor Clc. Another electrode Alc2 of the display medium capacitor Clc is electrically connected to a reference potential, wherein the reference potential may be a ground potential, a fixed potential or an adjustable potential. The first terminal T2a of the second transistor T2 is electrically connected to the second terminal T1b of the first transistor T1. The control terminal T2c of the second transistor T2 is electrically connected to the capacitance control line CL. The second terminal T2b of the second transistor T2 is electrically connected to an electrode Ast1 of the storage capacitor Cst. Another electrode Ast2 of the storage capacitor Cst is electrically connected to a reference potential, wherein the reference potential may be a ground potential, a fixed potential or an adjustable potential.

Differences between the pixel structure PX' of FIG. 7 and the pixel structure PX of FIG. 1 lie in that: the pixel structure PX' of FIG. 7 may not include the third transistor T3 of FIG. 1, and the control terminal T2c of the second transistor T2 of the pixel structure PX' of FIG. 7 can directly be electrically connected to the capacitance control line CL.

Figure 8:
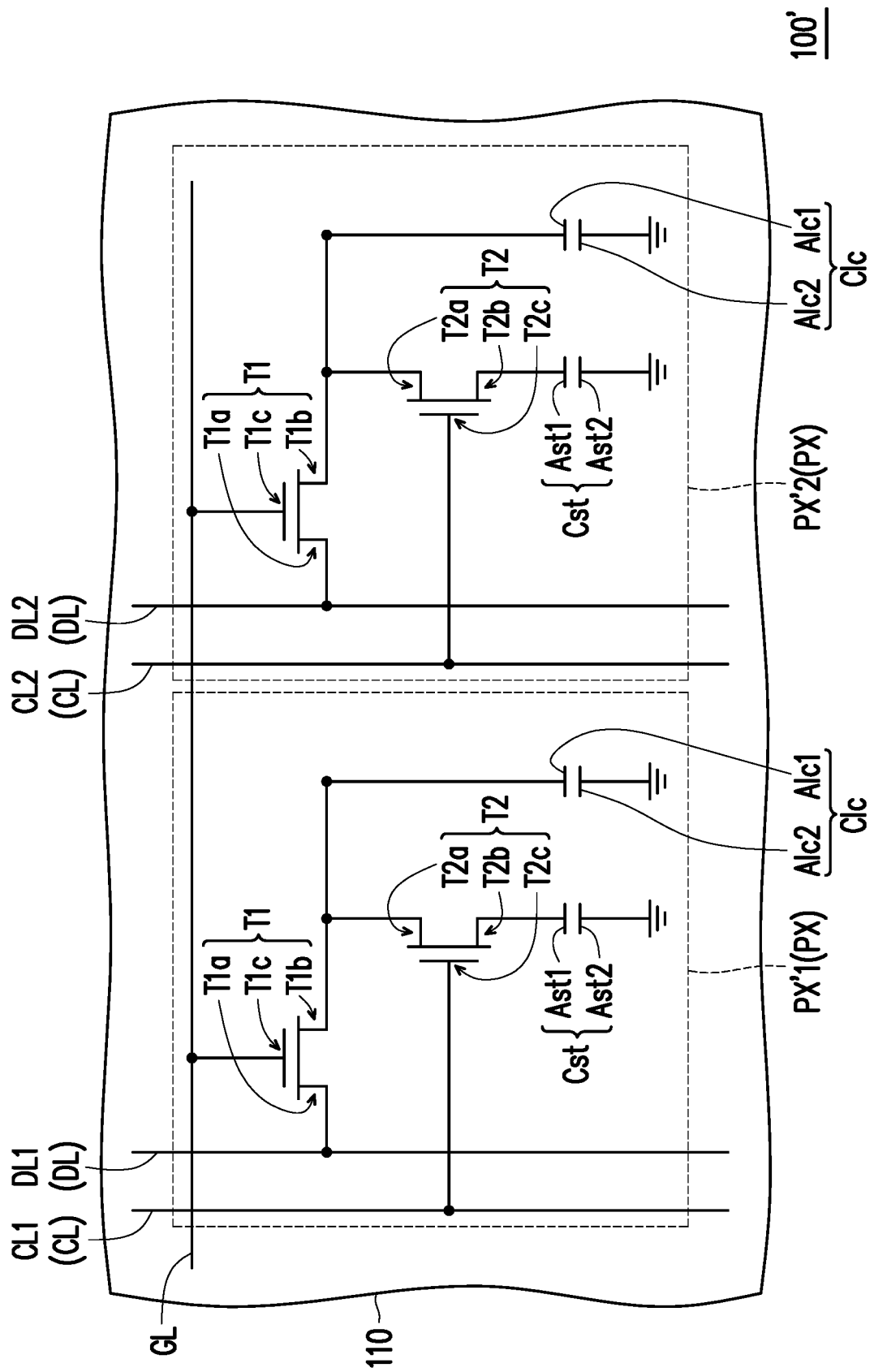
FIG. 8 is a schematic top diagram of a semiconductor substrate according to the second embodiment of the invention.

FIG. 8 is a schematic top diagram of a semiconductor substrate according to the second embodiment of the invention. Referring to FIG. 8, the semiconductor substrate 100' includes a base 110 and a plurality of pixel structures PX' disposed on the base 110. The scanning lines GL of a part of pixel structures PX'1, PX'2 of the semiconductor substrate 100' may be connected to each other. The data lines DL1, DL2 of the part of pixel structures PX'1, PX'2 of the semiconductor substrate 100' may be separated from each other and sequentially arranged. The capacitance control lines CL1, CL2 of the part of pixel structures PX'1, PX'2 of the semiconductor substrate 100' may be separated from each other and sequentially arranged.

Figure 9:
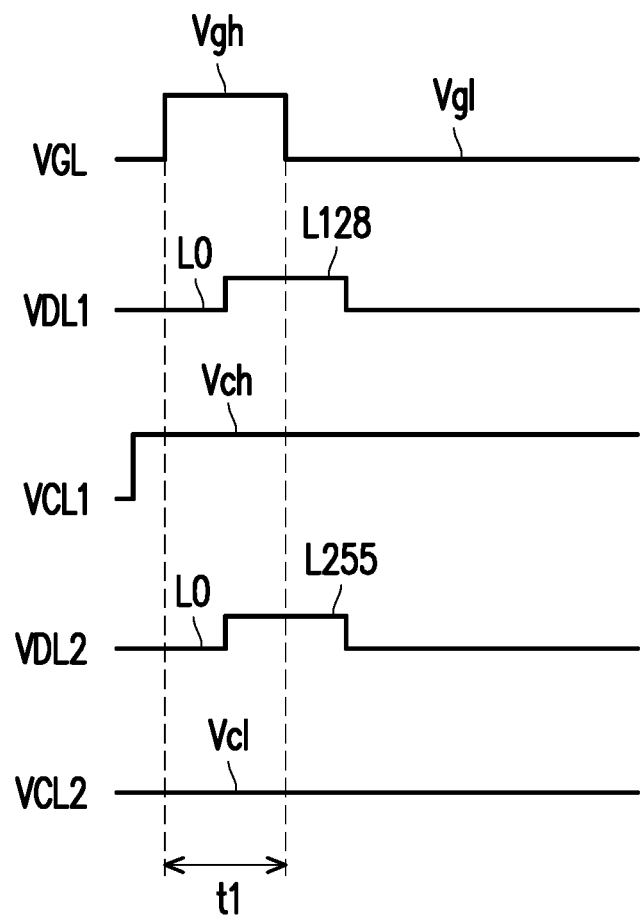
FIG. 9 illustrates a scanning signals VGL, a data signal VDL1, a data signal VDL2, a control signal VCL1, and a control signal VCL2 respectively having by a scan line GL, a data line DL1, a data line DL2, a capacitance control line CL1, and a capacitance control line CL2 of FIG. 8 in a time interval t1.

FIG. 9 illustrates a scanning signals VGL, a data signal VDL1, a data signal VDL2, a control signal VCL1, and a control signal VCL2 respectively having by the scan line GL, the data line DL1, the data line DL2, the capacitance control line CL1, and the capacitance control line CL2 of FIG. 8 in the time interval t1.

Referring to FIG. 8 and FIG. 9, in the embodiment, during the time interval t1, the scanning signal VGL of the scanning line GL of the pixel structure PX'1 has a high scanning potential Vgh, and the data signal VDL1 of the data line DL1 of the pixel structure PX'1 is switched from the grayscale value L0 to the grayscale value L128. A RMS voltage value of the data signal VDL1 corresponding to the grayscale value L128 is VL128. When it is determined that the grayscale value L128 is between the first preset value and the second preset value, the control signal VCL1 of the capacitance control line CL1 of the pixel structure PX'1 is enabled to have a high control potential Vch. At this time, the first transistor T1 and the second transistor T2 of the pixel structure PX'1 are both turned ON, and the storage capacitor Cst and the display medium capacitor Clc of the pixel structure PX'1 are to be charged. In this way, even if the pixel structure PX'1 has a leakage current during a process in which the pixel structure PX'1 is used for displaying an image, the leakage current accounts for a small proportion of a total amount of charge originally stored in the storage capacitor Cst and the display medium capacitor Clc of the pixel structure PX' 1 is low, and therefore, the leakage current does not cause an excessive voltage drop in the display medium capacitor Clc. Accordingly, even if the pixel structure PX'1 is operated at the grayscale value L128 and the brightness of the pixel structure PX'1 is sensitive to a voltage change near the RMS voltage value VL128, a degree of flicker in the display panel 10' adopting the pixel structure PX'1 (as shown in FIG. 10) is still slight and conforms with the product specifications.

Referring again to FIG. 8 and FIG. 9, in the time interval t1, the scanning signal VGL of the scanning line GL of the pixel structure PX'2 has a high scanning potential Vgh, and the data signal VDL2 of the data line DL2 of the pixel structure PX'2 is switched from the grayscale value L0 is switched to the grayscale value L255. The RMS voltage value of the data signal VDL2 corresponding to the grayscale value L255 is VL255. When it is determined that the grayscale value L255 is greater than the second preset value or the grayscale value L255 is less than the first preset value, the control signal VCL2 of the capacitance control line CL2 of the pixel structure PX'2 is enabled to have a low control potential Vcl. At this time, the first transistor T1 of the pixel structure PX'2 is turned ON, the second transistor T2 of the pixel structure PX'2 is turned OFF, the display medium capacitor Clc of the pixel structure PX'2 is to be charged, and the storage capacitor Cst of the pixel structure PX'2 is not to be charged. In this way, even if the pixel structure PX'2 has a leakage current during a process in which the pixel structure PX'2 is used for displaying an image and the leakage current accounts for a large proportion of a total amount of charge originally stored in the display medium capacitance Clc, because the brightness of the pixel structure PX'2 is insensitive to the voltage change near the RMS voltage value VL255, the leakage current does not cause the brightness of the pixel structure PX'2 to change excessively. That is, when the grayscale value L255 is greater than the second preset value or less than the first preset value, even if the second transistor T2 is turned OFF without charging the storage capacitor Cst, a degree of flicker in the display panel 10' of the pixel structure PX'2 is still slight and conforms with the product specifications. Further, since it is passable to not charge the storage capacitor Cst of the pixel structure PX'2, the display panel 10' can achieve the power saving effect in a case where the degree of flicker conforms to the specification value.

Figure 10:
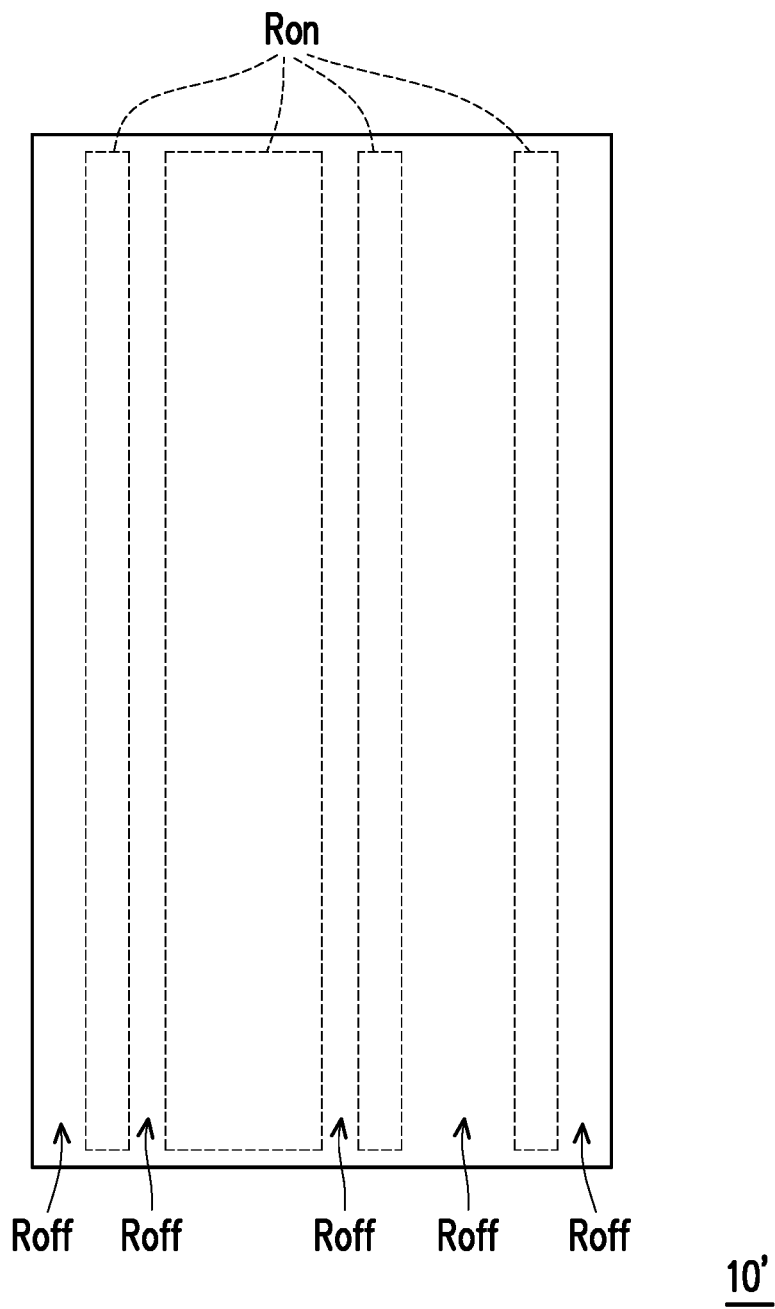
FIG. 10 is a schematic diagram of a display panel according to the second embodiment of the invention.

FIG. 10 is a schematic diagram of a display panel according to the second embodiment of the invention. Referring to FIG. 10, the display panel 10' includes the semiconductor substrate 100' (not shown) having the pixel structure PX' described above, an opposite substrate (not shown) opposite to the semiconductor substrate 100', and a display medium (not shown; for example, but not limited to: liquid crystal) disposed between the semiconductor substrate 100' and the opposite substrate. The display panel 10' has a plurality of display regions Ron, Roff. In the present embodiment, the ON or OFF of the second transistors T2 respectively located in the display regions Ron, Roff of the pixel structures PX' may be determined according to characteristics of an image displayed by each of the display regions Ron, Roff. The second transistors T2 in the display regions Ron are turned ON, and the second transistors T2 in the display regions Roff are turned OFF. In the present embodiment, the ON or OFF of the second transistors T2 of the pixel structures PX' in the same column is determined by the control signal VCL of a same capacitance control line CL, wherein the display regions Ron in which the second transistor T2 are turned ON and the display regions Roff in which the second transistor T2 are turned OFF may be located in different columns, but the invention is not limited thereto.

Figure 11:
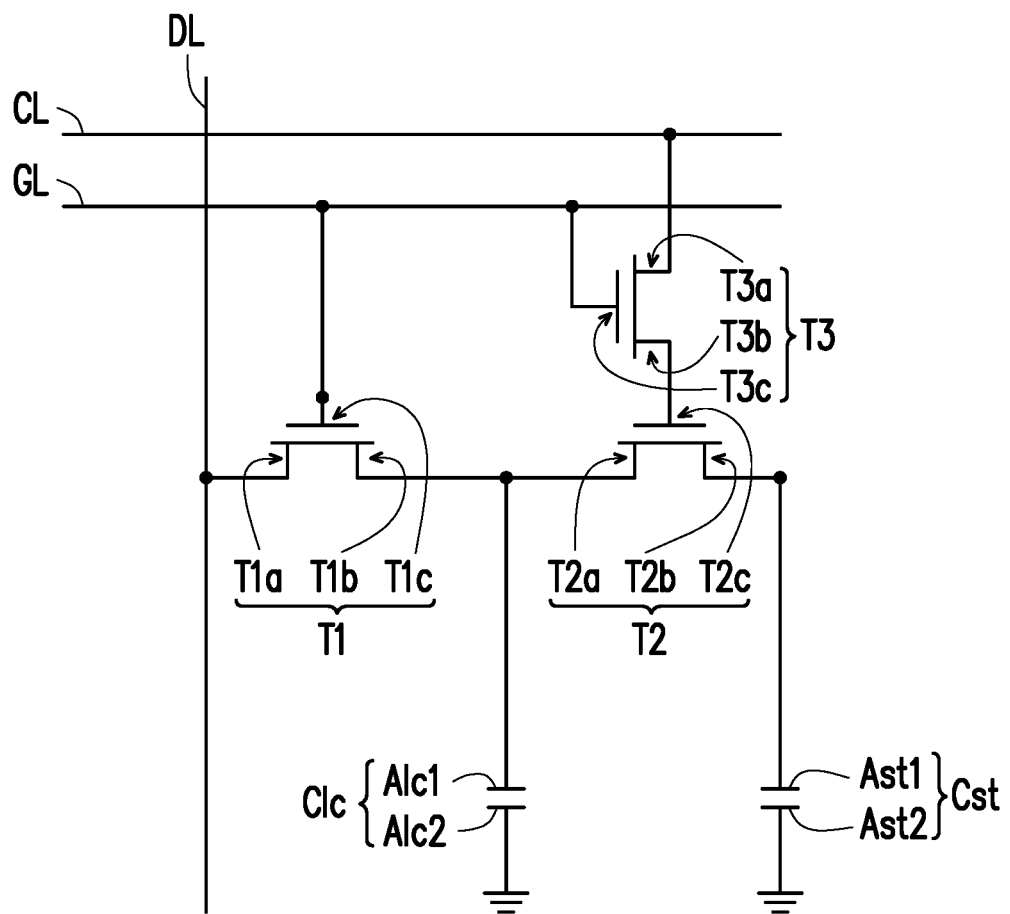
FIG. 11 is a schematic diagram of a pixel structure PX-1 according to a third embodiment of the invention.

FIG. 11 is a schematic diagram of a pixel structure PX-1 according to a third embodiment of the invention. The pixel structure PX-1 of FIG. 11 is similar to the pixel structure PX of FIG. 1, and a difference between the two lies in that: in the embodiment of FIG. 1, the capacitance control line CL crosses the scanning line GL; in the embodiment of FIG. 11, the capacitance control line CL is parallel to the scanning line GL. As such, the capacitance control line CL and the scan line GL can be electrically connected to a gate driver on array (GOA; not shown) located on at least one side of the display panel 10', thereby reducing the number of pads (not shown) for bonding chips (not shown). In addition, the pixel structure PX-1 of the present embodiment can be driven with the method of driving the aforementioned pixel structure PX, which will not be repeated herein.

Figure 12:
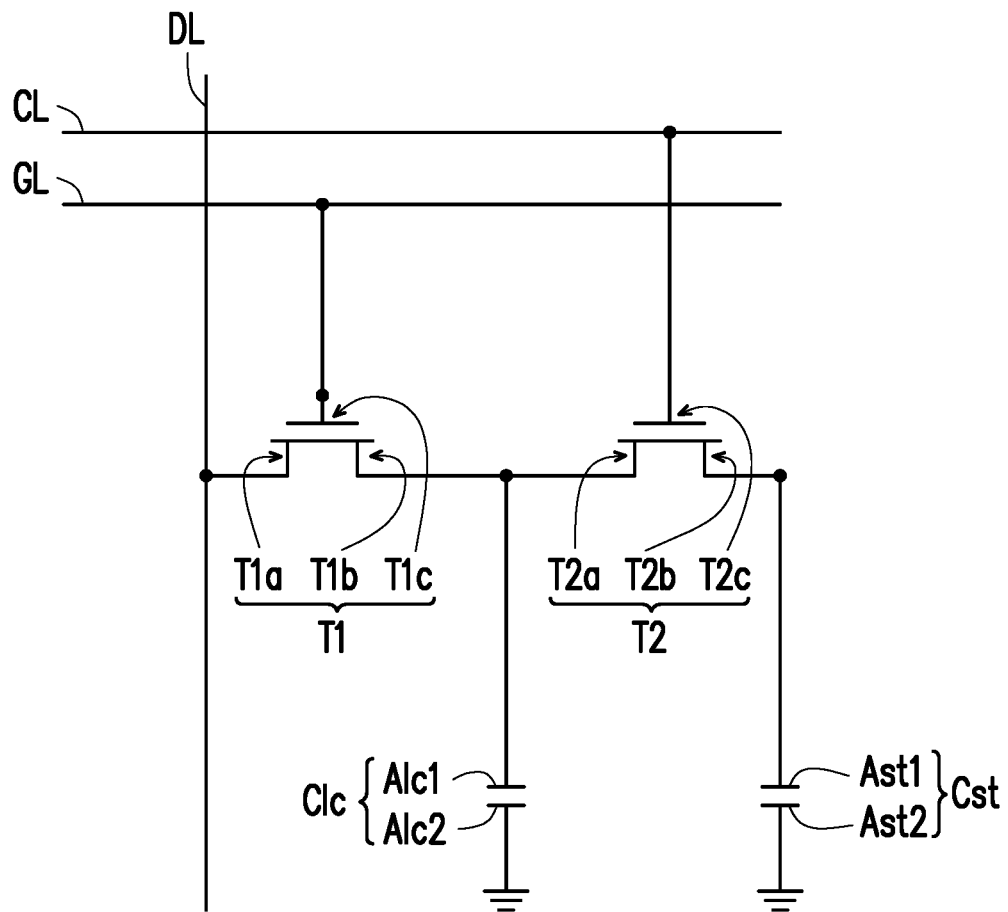
FIG. 12 is a schematic diagram of a pixel structure PX'-1 according to a fourth embodiment of the invention.

FIG. 12 is a schematic diagram of a pixel structure PX'-1 according to a fourth embodiment of the invention. The pixel structure PX'-1 of FIG. 12 is similar to the pixel structure PX' of FIG. 7, and a difference between the two lies in that: in the embodiment of FIG. 7, the capacitance control line CL crosses the scanning line GL; in the embodiment of FIG. 12, the capacitance control line CL is parallel to the scanning line GL. The pixel structure PX'-1 can be driven with the method of driving the aforementioned pixel structure PX', which will not be repeated herein.

Figure 13:
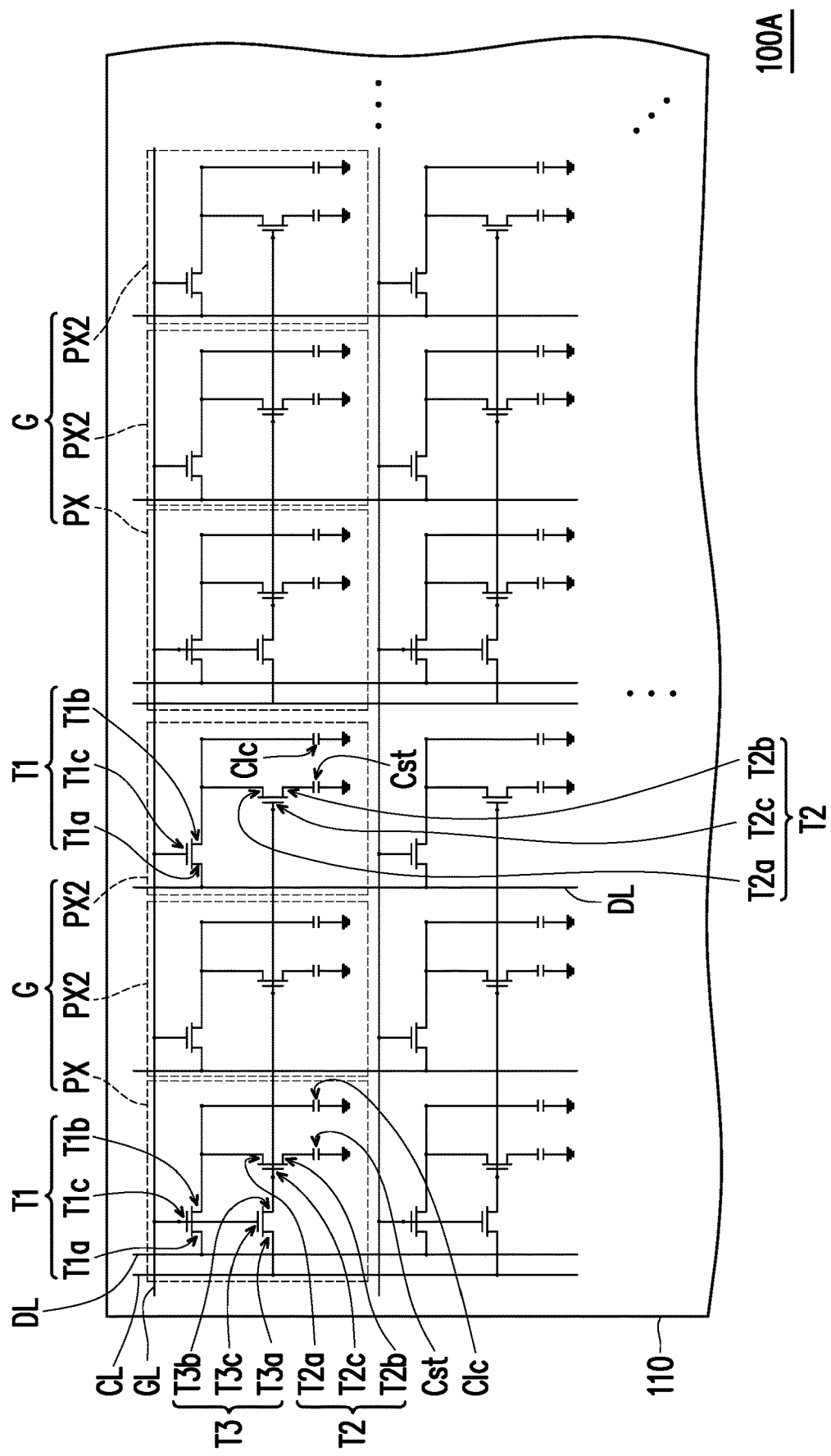
FIG. 13 is a schematic diagram of a semiconductor substrate 100A according to a fifth embodiment of the invention.

FIG. 13 is a schematic diagram of a semiconductor substrate 100A according to a fifth embodiment of the invention. Referring to FIG. 13, the semiconductor substrate 100A includes a plurality of pixel groups G arranged in an array. Each of the pixel groups G further includes at least one pixel structure PX2 in addition to the aforementioned pixel structure PX, wherein the pixel structure PX is different from the pixel structure PX2. Specifically, differences between the pixel structure PX2 and the aforementioned pixel structure PX lie in that the pixel structure PX2 does not include the third transistor T3 of the pixel structure PX and the capacitance control line CL of the pixel structure PX, and the control terminal T2c of the second transistor T2 of the pixel structure PX2 is electrically connected to the second terminal T3b of the third transistor T3 of the pixel structure PX of the same pixel group G. In the present embodiment, the pixel structure PX, the pixel structure PX2 and the pixel structure PX2 of the same pixel group G are, for example, used to display red color, green color and blue color, but the invention is not limited thereto.

Figure 14:
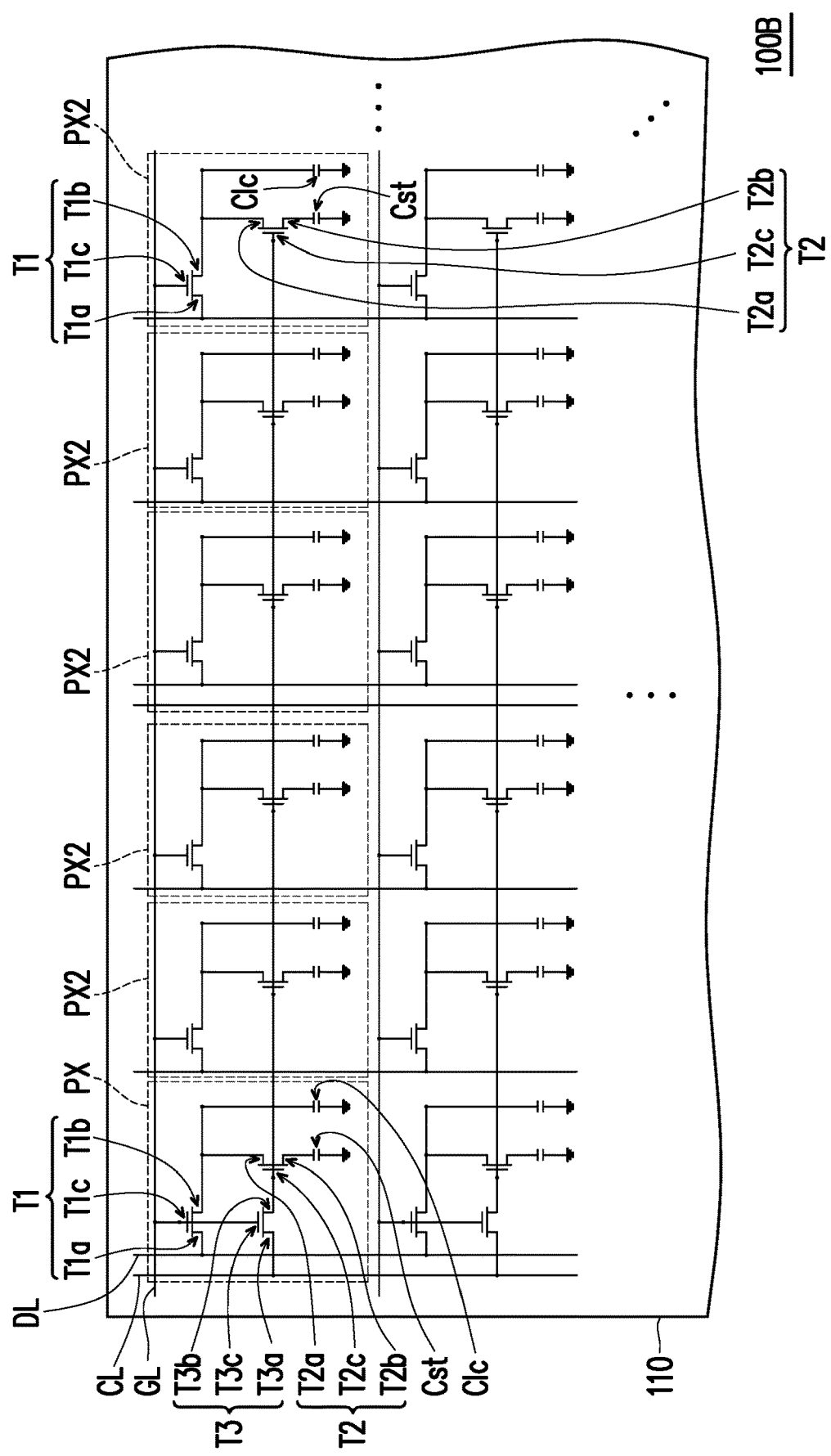
FIG. 14 is a schematic diagram of a semiconductor substrate 100B according to a sixth embodiment of the invention.

FIG. 14 is a schematic diagram of a semiconductor substrate 100B according to a sixth embodiment of the invention. Referring to FIG. 14, the semiconductor substrate 100B includes a plurality of pixel structures PX and a plurality of pixel structures PX2, wherein a difference between each pixel structure PX2 and each pixel structure PX lies in that the pixel structure PX2 does not include the third transistor T3 and the capacitance control line CL of the pixel structure PX. The pixel structures PX and the pixel structures PX2 are arranged into a plurality of rows. The scanning line GL of the pixel structure PX in each row is electrically connected to the scanning lines GL of the pixel structures PX2 in the row. In particular, the control terminals T2c of the second transistors T2 of all the pixel structures PX2 in a same row are electrically connected to the second terminal T3b of the third transistor T3 of the pixel structure PX in the same row.

Figure 15:
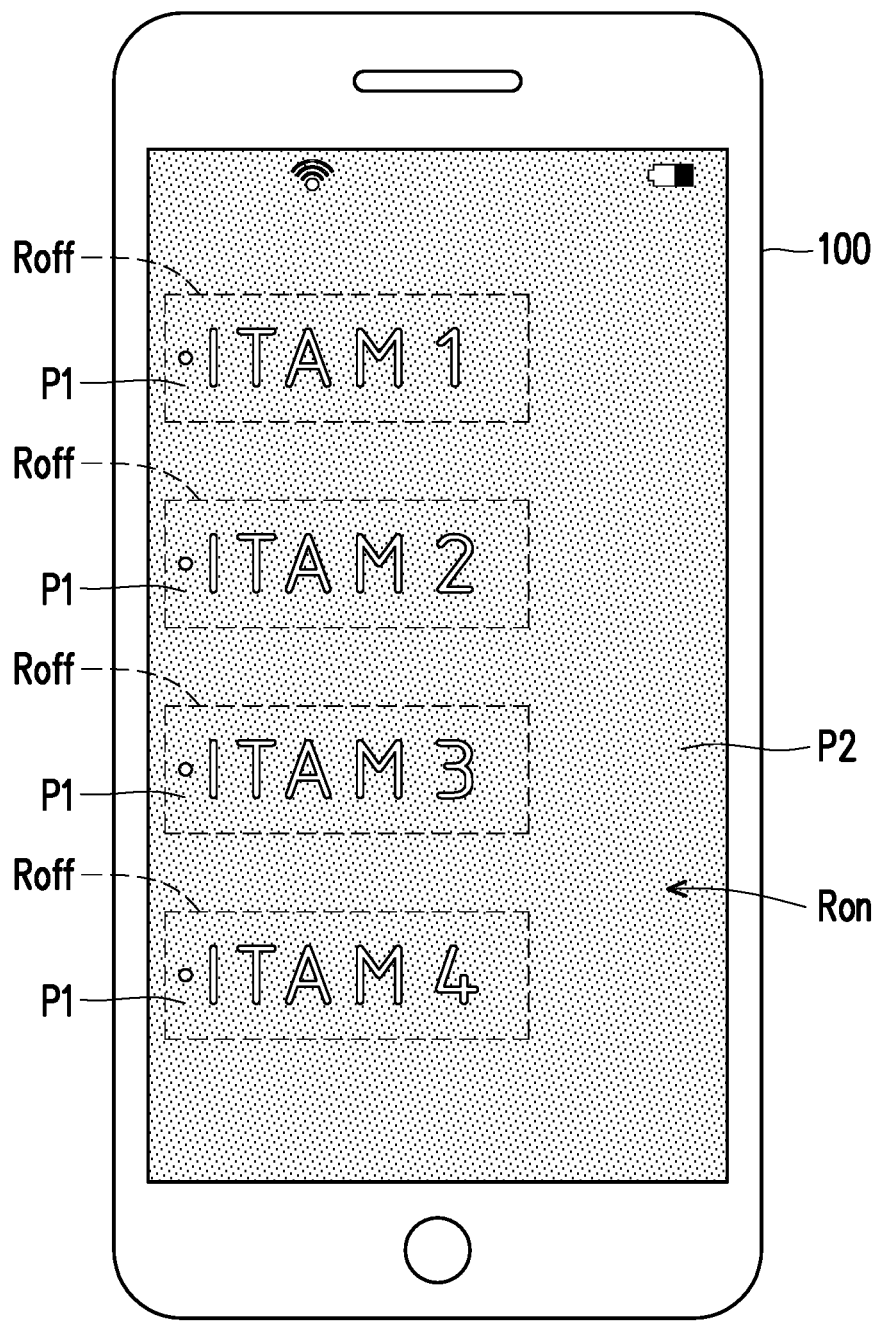
FIG. 15 shows an electronic apparatus adopting the semiconductor substrate of any of the embodiments of the invention.

FIG. 15 shows an electronic apparatus adopting the semiconductor substrate of any of the embodiments of the invention. Referring to FIG. 15, the electronic apparatus 1 includes a display panel having the semiconductor substrate 100. The electronic apparatus 1 determines whether to turn ON or OFF the second transistors T2 of the pixel structures PX according to characteristics of a plurality of pixels P1, P2 of the pixel structures PX. For example, when the electronic apparatus 1 is in a first application scenario, the display panel of the electronic apparatus 1 displays static images P1, P2, wherein frame rates of the static images P1, P2 are low, which are, for example, but not limited to: 5 Hz. The static images include a first image P1 and a second image P2, which are respectively located in the display region Roff and the display region Ron. The first pixel structures PX of the display region Roff of the display panel of the electronic apparatus 1 are used to display the first image P1. The second pixel structure PX of the display region Ron of the display panel of the electronic apparatus 1 is used to display the second image P2. When it is determined that the first image P1 includes a gray screen and white characters interspersed in the gray screen, the second transistors T2 of the first pixel structures PX in the display region Roff are to be turned OFF. At this time, it is no need to charge the storage capacitors Cst of the first pixel structures PX in the display region Roff, and the electronic apparatus 1 can save power. Moreover, since it is not required to charge the storage capacitors Cst of the first pixel structures PX in the display region Roff, and a charging rate of the first pixel structures PX is high. When the charging rate of the first pixel structures PX is sufficiently high, there is no problem with insufficient brightness at edges of the white characters due to a low charging rate. On the other hand, when it is determined that the second image P2 includes a full gray screen, the second transistors T2 of the second pixel structures PX in the display region Ron are turned ON to ameliorate the flickering problem.

Figure 16:
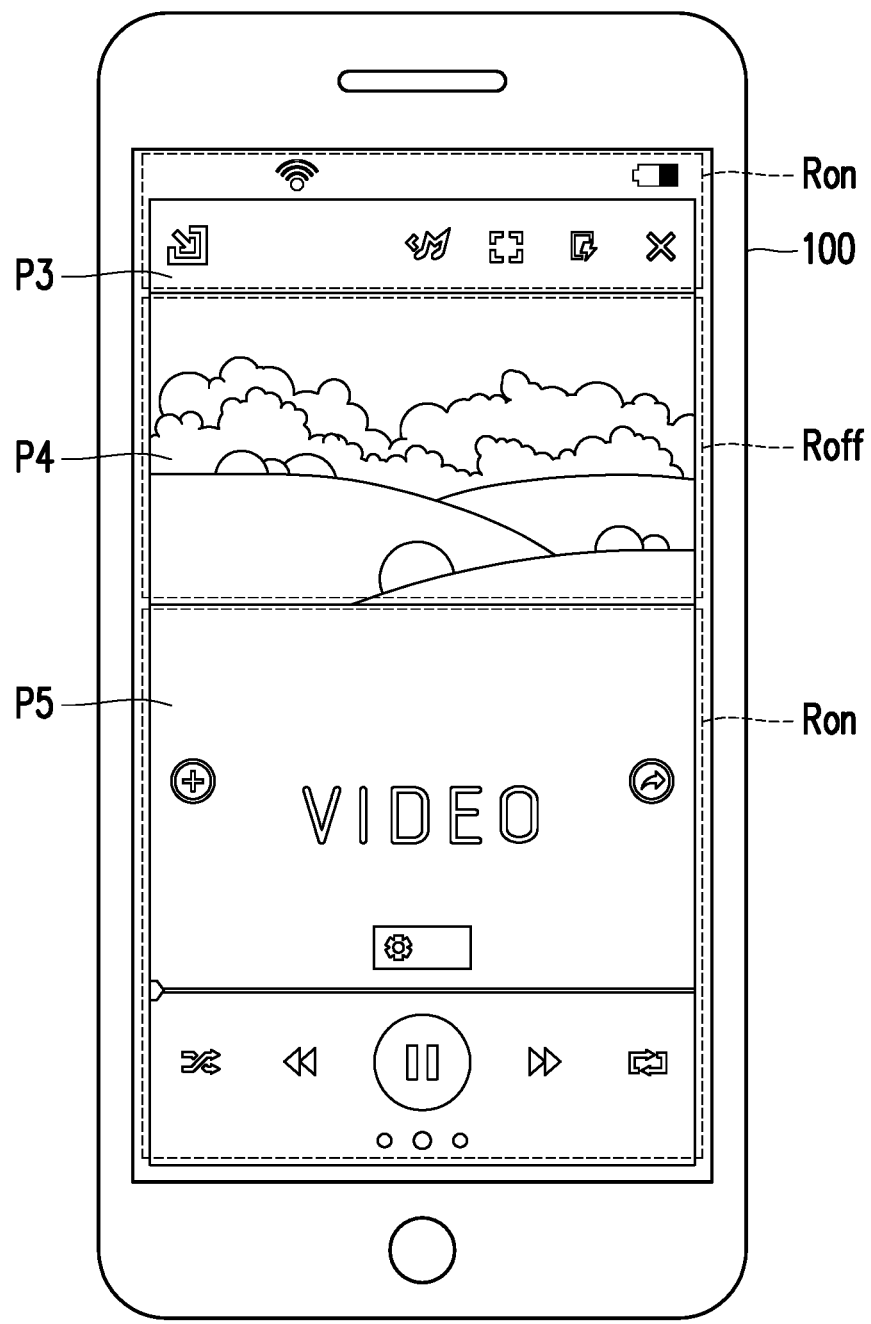
FIG. 16 shows an electronic apparatus adopting the semiconductor substrate of any of the embodiments of the invention.

FIG. 16 shows an electronic apparatus adopting the semiconductor substrate of any of the embodiments of the invention. Referring to FIG. 16, the electronic apparatus 1 includes a display panel having the semiconductor substrate 100. The electronic apparatus 1 determines whether to turn ON or OFF the second transistors T2 of the pixel structures PX according to characteristics of a plurality of pixels P3, P4, P5 of the pixel structures PX. For example, when the electronic apparatus 1 is in a second application scenario, images P3, P4, P5 displayed by the display panel of the electronic apparatus 1 include static images P3 and P5 and a dynamic image P4, wherein frame rates of the static images P3, P5 are low (for example but not limited to: 5 Hz), and a frame rate of the dynamic image P4 is high (for example but not limited to: 60 Hz). The static image P3, the dynamic image P4 and the static image P5 are located in the display region Ron, the display region Roff and the display region Ron, respectively. The electronic apparatus 1 can determine the ON or OFF of second transistors T2 of the pixel structures PX according to the frame rates of the images P3, P4 and P5. Specifically, the first pixel structures PX in the display region Ron at the upper part of FIG. 16 and the first pixel structures PX in the display region Ron at the lower part of FIG. 16 are respectively used to display the static image P3 and the static image P5. When it is determined that the frame rates of the first images P3 and P5 are equal to or lower than the first preset frequency (for example, but not limited to: 5 Hz), the second transistor T2 of the first pixel structures PX located in the display region Ron are enabled to be turned ON, so as to ameliorate the flickering problem. When it is determined that the frame rate of the second image P4 is equal to or higher than the second preset frequency (for example, but not limited to: 60 Hz), the second transistors T2 of the second pixel structures PX in the display region Ron are enabled to be turned OFF, so as to save power while ameliorating the flickering problem.

Figure 17:
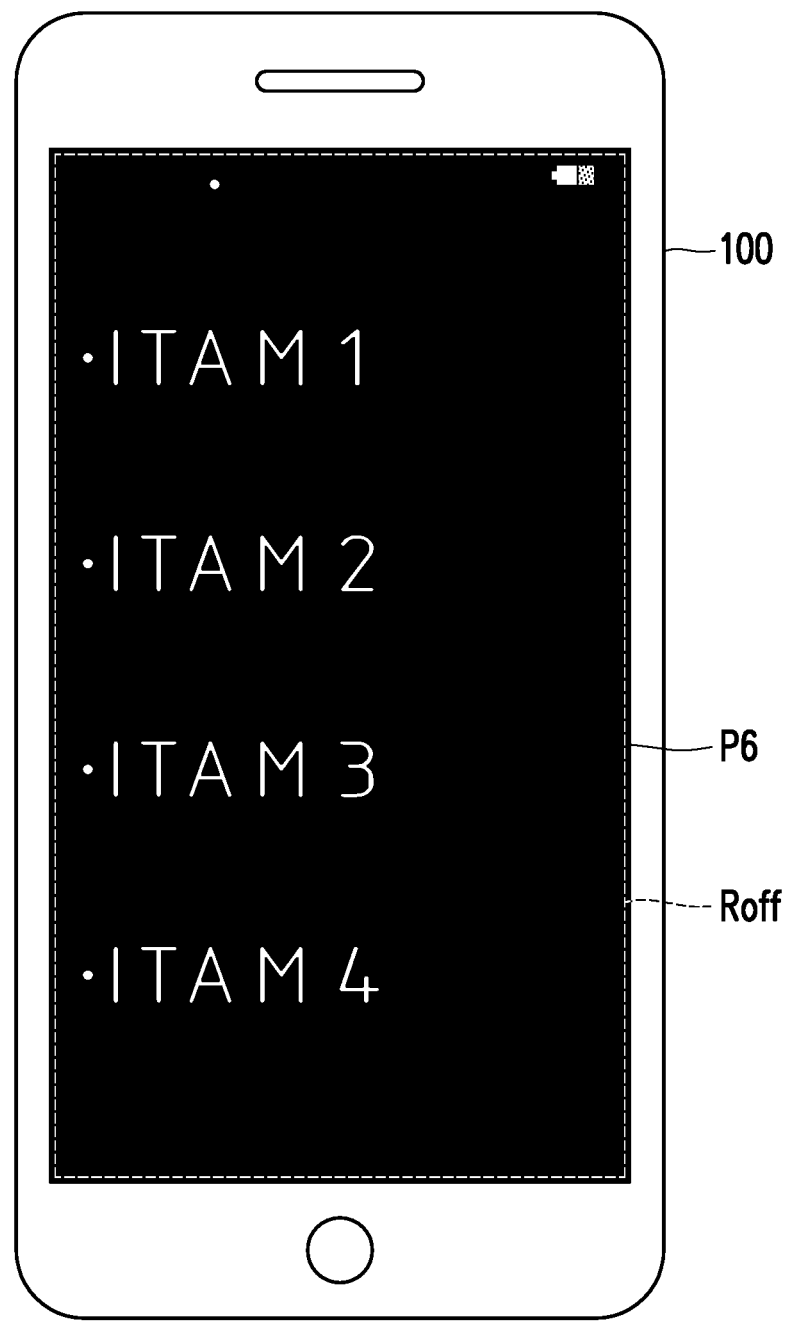
FIG. 17 shows an electronic apparatus adopting the semiconductor substrate of any of the embodiments of the invention.

FIG. 17 shows an electronic apparatus adopting the semiconductor substrate of any of the embodiments of the invention. Referring to FIG. 17, the electronic apparatus 1 includes a display panel having the semiconductor substrate 100. The electronic apparatus 1 determines the ON or OFF of the second transistors T2 of the pixel structures PX according to characteristics of an image P6 of the pixel structures PX. For example, when the electronic apparatus 1 is in a third application scenario, the image P6 of the display panel of the electronic apparatus 1 is a static image having white characters on a black background. The pixel structures PX in the display region Roff of the display panel of the electronic apparatus 1 are used to display the image P6. At this time, the second transistors T2 of all the pixel structures PX can be turned OFF, and there is no need to charge the storage capacitors Cst of the pixel structures PX in the display region Roff. Thus, the electronic apparatus 1 can save power. At the same time, the display panel of the electronic apparatus 1 also does not cause problems of flicker and insufficient charging rate.

Figure 18:
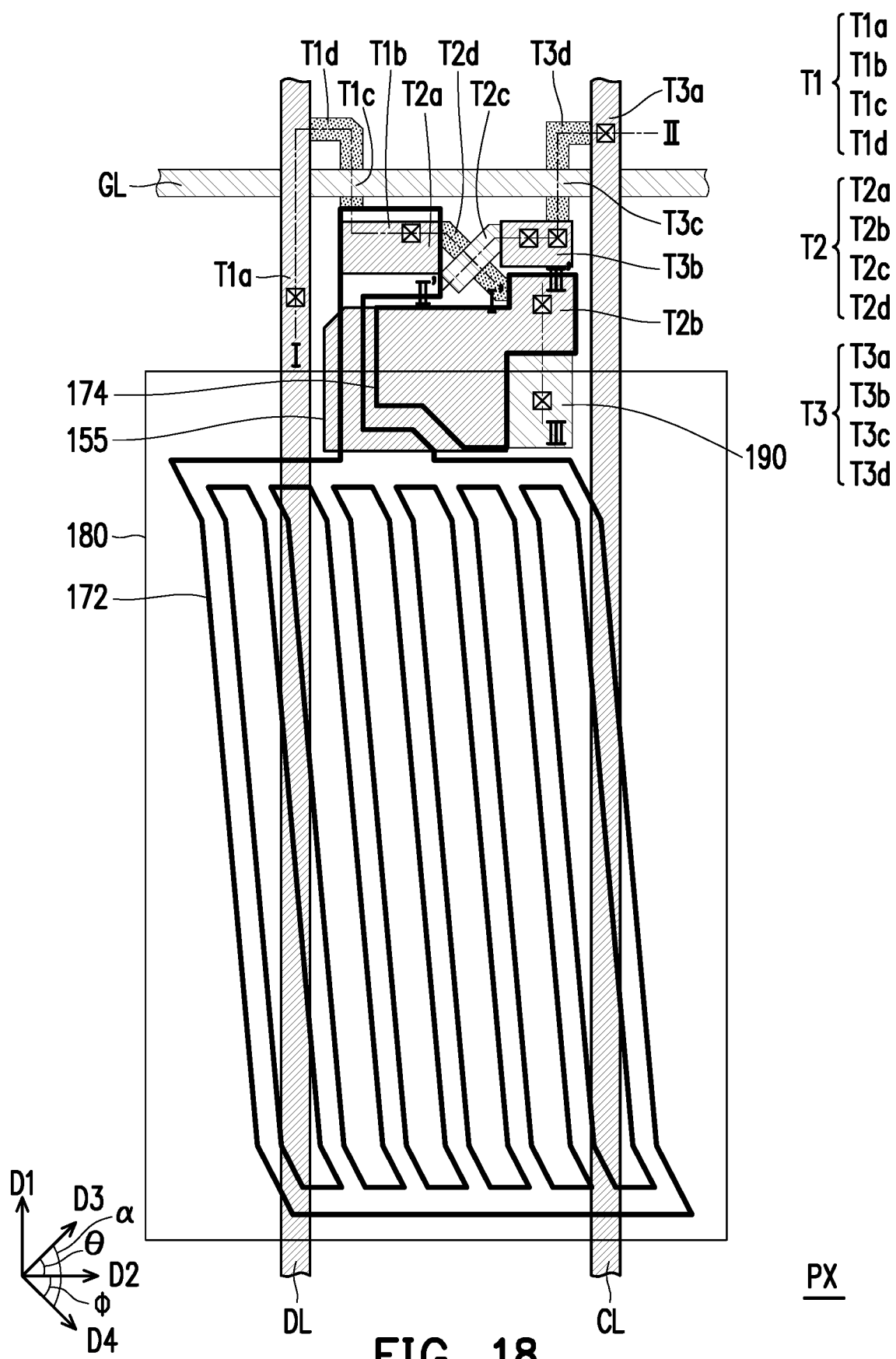
FIG. 18 illustrates a pixel structure PX according to an embodiment of the invention.
Figure 19:
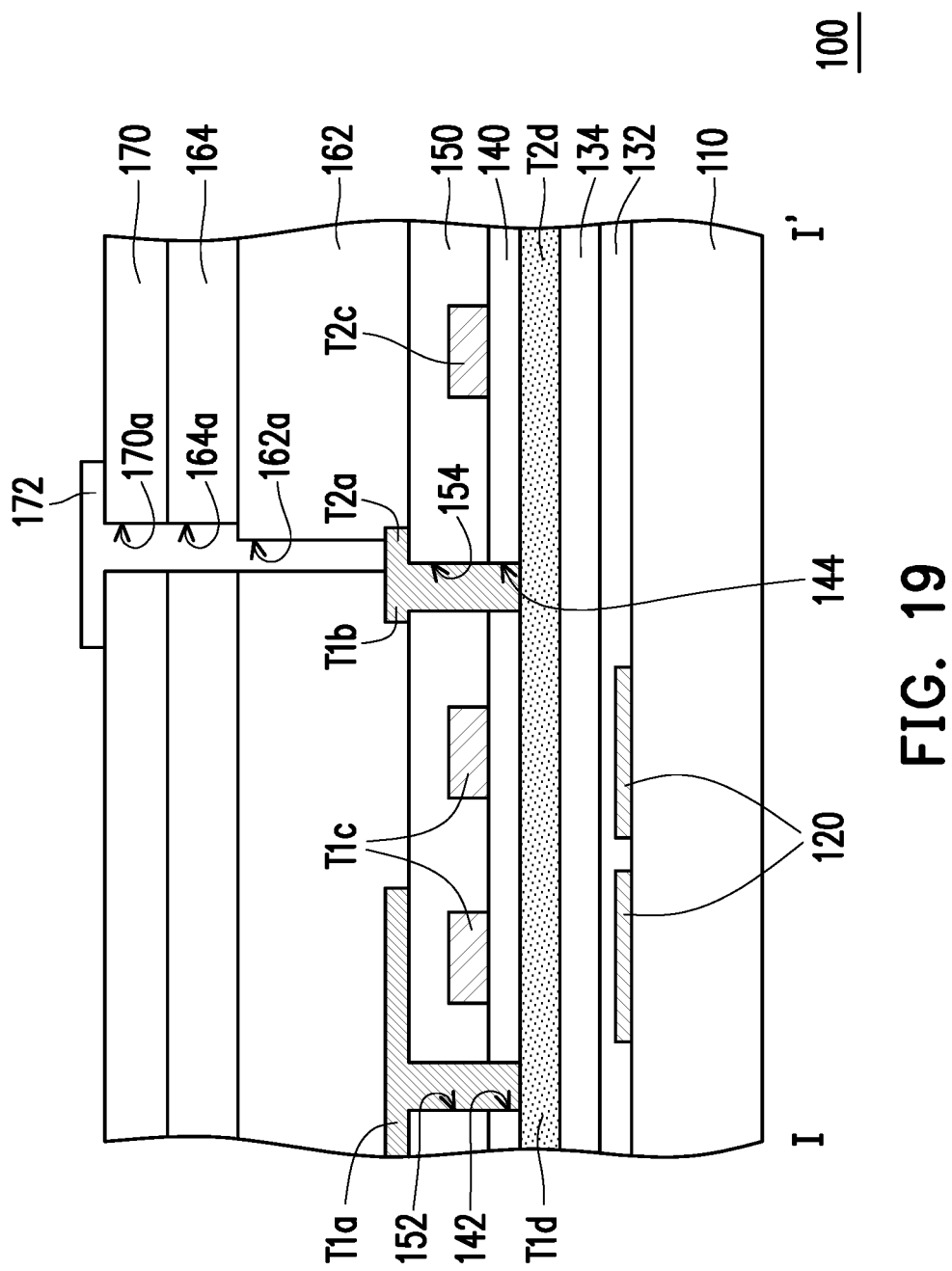
FIG. 19 is a cross-sectional schematic diagram of a semiconductor substrate 100 illustrated corresponding to the section line I-I' of FIG. 18.
Figure 20:
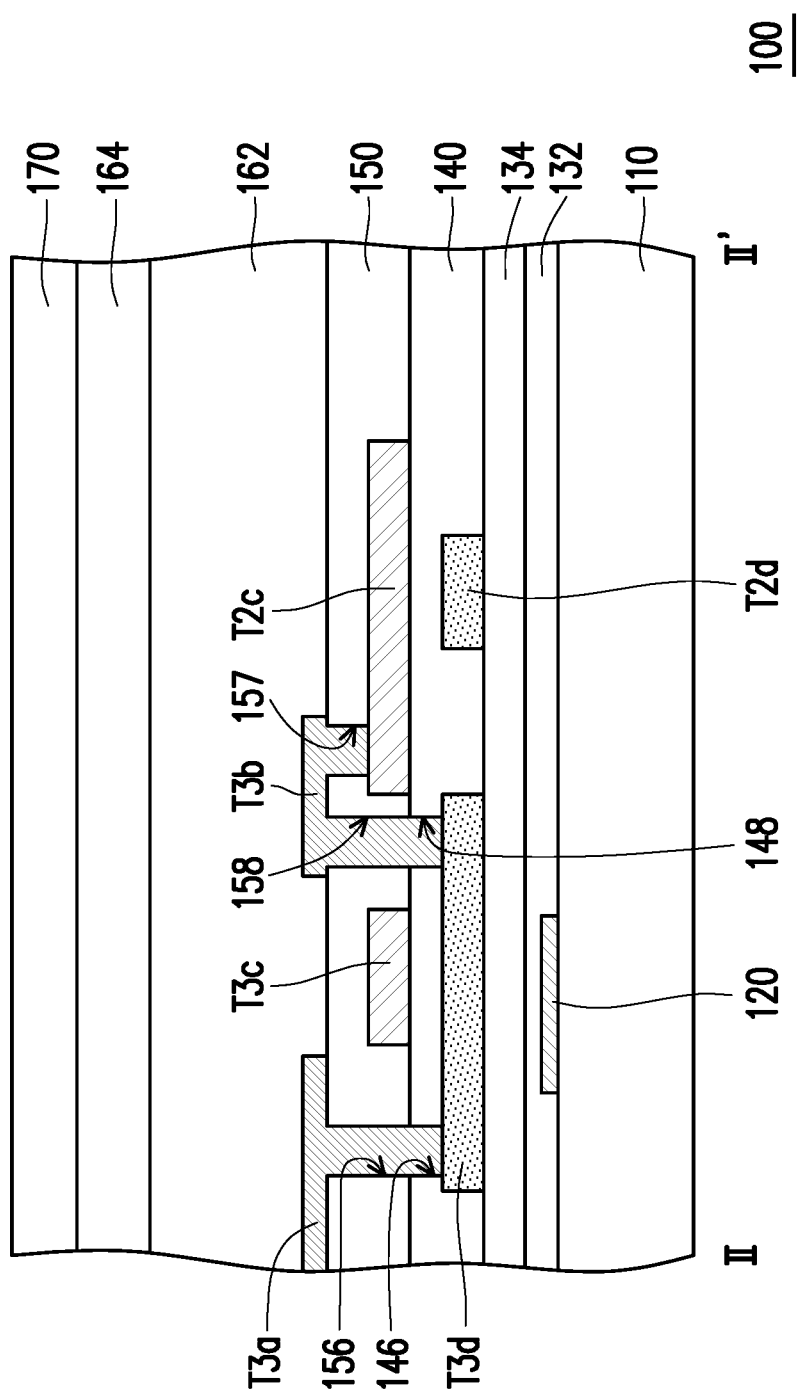
FIG. 20 is a cross-sectional schematic diagram of the semiconductor substrate 100 illustrated corresponding to the section line II-II' of FIG. 18.
Figure 21:
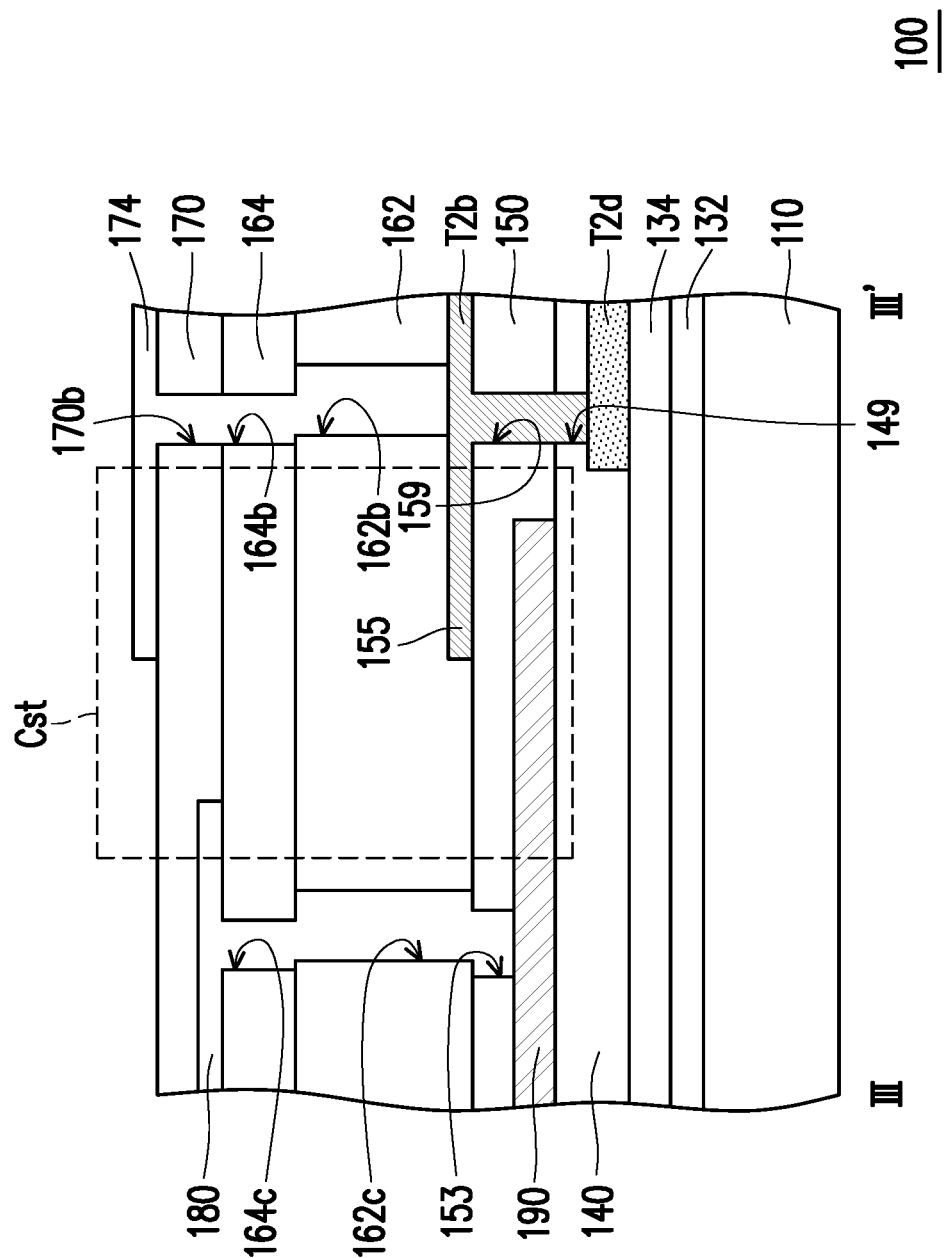
FIG. 21 is a cross-sectional schematic diagram of the semiconductor substrate 100 illustrated corresponding to the section line III-III' of FIG. 18.

FIG. 18 illustrates a pixel structure PX according to an embodiment of the invention. The pixel structure PX depicted in FIG. 18 is the actual layout of the pixel structure PX of FIG. 1. FIG. 19 is a cross-sectional schematic diagram of a semiconductor substrate 100 illustrated corresponding to the section line IT of FIG. 18. FIG. 20 is a cross-sectional schematic diagram of the semiconductor substrate 100 illustrated corresponding to the section line H-H' of FIG. 18. FIG. 21 is a cross-sectional schematic diagram of the semiconductor substrate 100 illustrated corresponding to the section line III-III' of FIG. 18.

Referring to FIG. 18 to FIG. 21, the semiconductor substrate 100 includes a base 110 and a pixel structure PX disposed on the base 110. The base 110 is mainly used for carrying the pixel structure PX, and a material thereof may be glass, quartz, organic polymer, opaque/reflective material (for example: conductive material, wafer, ceramic, or other applicable material), or other applicable materials.

In the present embodiment, the semiconductor substrate 100 may selectively include a light shielding layer 120. The light shielding layer 120 is disposed on the base 110. For example, in the embodiment, a material of the light shielding layer 120 may be a metallic material, an alloy, a nitride of metallic material, an oxide of metallic material, an oxynitride of metallic material, or a combination thereof. However, the invention is not limited thereto. According to other embodiments, the material of the light shielding layer 120 may also be other conductive material capable of blocking light, non-conductive material capable of blocking light, or a combination thereof.

In the present embodiment, the semiconductor substrate 100 can selectively include insulating layers 132 and 134 disposed on the light shielding layer 120. For example, in the present embodiment, a material of the insulating layers 132 and 134 may be an inorganic material (such as: yttria, tantalum nitride, ytterbium oxynitride, or a stacked layer of at least two materials described above), an organic material or a combination of the above.

The semiconductor substrate 100 includes a semiconductor layer. The semiconductor layer includes a plurality of semiconductor patterns T1d, T2d and T3d of the first transistor T1, the second transistor T2 and the third transistor T3. In the present embodiment, the semiconductor patterns T1d, T2d and T3d are selectively disposed on the insulating layer 134. The semiconductor pattern T1d of the first transistor T1 and the semiconductor pattern T2d of the second transistor T2 may selectively be directly connected. The semiconductor pattern T3d of the third transistor T3 is separated from the semiconductor pattern T1d of the first transistor T1 and the semiconductor pattern T2d of the second transistor T2. For example, in the present embodiment, the semiconductor pattern T1d of the first transistor T1 may substantially be in an inverted U-shape, the semiconductor pattern T2d of the second transistor T2 may substantially be in an ↖-shape, and the semiconductor pattern T3d of the third transistor T3 may substantially be in an inverted L-shape, wherein the ↖-shaped semiconductor pattern T2d is substantially located between the inverted U-shaped semiconductor pattern T1d and the inverted L-shaped semiconductor pattern T3d, but the present invention does not Limited.

In the present embodiment, the light shielding layer 120 can shield (or overlap) the semiconductor patterns T1d, T2d and T3d of the first transistor T1, the second transistor T2 and the third transistor T3 to prevent and/or reduce the generation of light leakage. However, the invention is not limited thereto. According to other embodiments, the light shielding layer 120 may also be omitted.

In the present embodiment, the semiconductor patterns T1d, T2d and T3d may be a single layer or a multilayer structure. For example, in the present embodiment, a material of the semiconductor patterns T1d, T2d and T3d may include polysilicon. However, the invention is not limited thereto. According to other embodiments, the material of the semiconductor patterns T1d, T2d and T3d may also include amorphous germanium, microcrystalline germanium, single crystal germanium, organic semiconductor material, oxide semiconductor materials (e.g., indium zinc oxide, indium gallium zinc oxide, other suitable material, or a combination thereof), or other suitable material, or a dopant in the above materials, or a combination thereof.

It is to be noted that, in the present embodiment, the data line DL extends in a first direction D1, the scan line GL extends in a second direction D2, and at least a portion of the semiconductor pattern T2d of the second transistor T2 extends in a fourth direction D4 that intersects the first direction D1 and the second direction D2. The semiconductor pattern T2d extending in the fourth direction D4 is facilitative for configuring the second transistor T2 that serves as a switch of the storage capacitor Cst in a limited area.

In the present embodiment, the semiconductor substrate 100 further includes an insulating layer 140 disposed on the semiconductor patterns T1d, T2d and T3d. For example, in the present embodiment, a material of the insulating layer 140 may be an inorganic material (such as: yttrium oxide, tantalum nitride, ytterbium oxynitride, or a stacked layer of at least two materials described above), an organic material or a combination thereof.

In the present embodiment, the semiconductor substrate 100 further includes a first metal layer. The first metal layer may selectively include the scan line GL, the control terminal T1c of the first transistor T1, the control terminal T2c of the second transistor T2, the control terminal T3c of the third transistor T3, and a common electrode 190. The control terminal T1c of the first transistor T1, the control terminal T2c of the second transistor T2 and the control terminal T3c of the third transistor T3 are respectively overlapped with the semiconductor pattern T1d of the first transistor T1, the semiconductor pattern T2d of the second transistor T2 and the semiconductor pattern T3d of the third transistor T3.

The control terminal T1c of the first transistor T1 is electrically connected to the scan line GL. For example, in the present embodiment, the control terminal T1c of the first transistor T1 may be two portions of the scan line GL that interlace with the semiconductor pattern T1d; that is, in the present embodiment, the first transistor T1 may be a double gate transistor, but the invention is not limited thereto. The control terminal T3c of the third transistor T3 is electrically connected to the scan line GL. For example, in the present embodiment, the control terminal T3c of the third transistor T3 may be a portion of the scan line GL that interlaces with the semiconductor pattern T3d; that is, in the present embodiment, the third transistor T3 may be a single gate transistor, but the invention is not limited thereto.

The control terminal T2c of the second transistor T2 is separated from the scanning line GL. For example, the control terminal T2c of the second transistor T2 may be a strip-shaped conductive pattern located beside the scanning line GL, but the invention is not limited thereto. It is to be noted that, in the present embodiment, the control terminal T2c of the second transistor T2 extends in a third direction D3, wherein the third direction D3 is intersected with the first direction D1, the second direction D2 and the fourth direction D4. That is, the control terminal T2c of the second transistor T2 is disposed to interlace with the semiconductor pattern T2d of the second transistor T2, and is not parallel to the data line DL and the scan line GL. Thus, it is facilitative for configuring the second transistor T2 that serves as a switch of the storage capacitor Cst in a limited area.

In the present embodiment, an extending direction of the scanning line GL (i.e., the second direction D2) has an included angle θ with an extending direction of the control terminal T2c of the second transistor T2 (i.e., the third direction D3). Preferably, 0°<θ<60°, but the invention is not limited thereto. The extending direction of the scanning line GL (i.e., the second direction D2) has an included angle D with an extending direction of the semiconductor pattern T2d of the second transistor T2 (i.e., the fourth direction D4). Preferably, 0°<Φ<60°, but the invention is not limited thereto. The extending direction of the control terminal T2c of the second transistor T2 (i.e., the third direction D3) has an included angle α with the extending direction of the semiconductor pattern T2d of the second transistor T2 (i.e., the fourth direction D4). Preferably, 0°<α≤90°, but the invention is not limited thereto.

The common electrode 190 has a reference potential, which may be a ground potential, a fixed potential or an adjustable potential. The common electrode 190 may be at least a portion of the electrode Ast2 (shown in FIG. 1) of the storage capacitor Cst. The common electrode 190 is separated from the scanning line GL and the control terminal T2c of the second transistor T2. For example, in the present embodiment, the control terminal T2c of the second transistor T2 may be located between the scan line GL and the common electrode 190. That is, a vertical projection of a portion of the second transistor T2 (e.g., the control terminal T2c) on the base 110 is located between a vertical projection of the scan line GL on the base 110 and a vertical projection of a portion of the storage capacitance Cst (e.g., the common electrode 190) on the base 110.

In the present embodiment, the scanning line GL, the control terminal T1c of the first transistor T1, the control terminal T2c of the second transistor T2, the control terminal T3c of the third transistor T3, and the common electrode 190 are, for example, made of metal. However, the invention is not limited thereto. According to other embodiments, the scan line GL, the control terminal T1c of the first transistor T1, the control terminal T2c of the second transistor T2, the control terminal T3c of the third transistor T3, and the common electrode 190 may also be made of other conductive material, such as: an alloy, a nitride of metallic material, an oxide of metallic material, an oxynitride of metallic material, or a stacked layer of metallic material and other electrically conductive material.

In the present embodiment, the semiconductor substrate 100 further includes an insulating layer 150 disposed on the scan line GL, the control terminal T1c of the first transistor T1, the control terminal T2c of the second transistor T2, the control terminal T3c of the third transistor T3, and the common electrode 190. For example, in the present embodiment, a material of the insulating layer 150 may be an inorganic material (such as: yttrium oxide, tantalum nitride, ytterbium oxynitride, or a stacked layer of at least two materials described above), an organic material or a combination thereof.

In the present embodiment, the semiconductor substrate 100 further includes a second metal layer disposed on the insulating layer 150. In the present embodiment, the second conductive layer may selectively include the data line DL, the capacitance control line CL, the first terminal T1a and the second terminal T1b of the first transistor T1, the first terminal T2a and the second terminal T2b of the second transistor T2, and the first terminal T3a and the second terminal T3b of the third transistor T3.

The data line DL is configured to cross the scan line GL. The data line DL extends in the first direction D1 and the scan line GL extends in the second direction D2, wherein the first direction D1 in intersected with the second direction D2. For example, in the present embodiment, the first direction D1 and the second direction D2 are selectively perpendicular, but the invention is not limited thereto. In the present embodiment, the capacitance control line CL is selectively disposed in parallel with the data line DL, but the invention is not limited thereto. According to other embodiments, the capacitance control line CL may also be disposed in other manners. For example, the capacitance control line CL may also be disposed in parallel with the scan line GL.

The first terminal T1a of the first transistor T1 is electrically connected to the data line DL. For example, in the present embodiment, the first terminal T1a of the first transistor T1 may be a portion of the data line DL that overlaps with the semiconductor pattern T1d, but the invention is not limited thereto. The first terminal T1a and the second terminal T1b of the first transistor T1 are each electrically connected to two different places of the semiconductor pattern T1c of the first transistor T1. Specifically, in the present embodiment, the first terminal T1a of the first transistor T1 can be electrically connected to the semiconductor pattern T1d of the first transistor T1 via contact windows 142 and 152 of the insulating layers 140 and 150, and the second terminal T1b of the first transistor T1 can be electrically connected to the semiconductor pattern T1d of the first transistor T1 via contact windows 144 and 154 of the insulating layers 140 and 150.

The first terminal T2a of the second transistor T2 is electrically connected to the second terminal T1b of the first transistor T1. For example, in the present embodiment, the first terminal T2a of the second transistor T2 and the second terminal T1b of the first transistor T1 may be two portions of a same first island-shaped pattern. The first terminal T2a and the second terminal T2b of the second transistor T2 are electrically connected to two different places of the semiconductor pattern T2d. For example, in the present embodiment, the first terminal T2a of the second transistor T2 can be electrically connected to the semiconductor pattern T2d of the second transistor T2 via the contact windows 144 and 154 of the insulating layers 140 and 150, and the second terminal T2b of the second transistor T2 can be electrically connected to the semiconductor pattern T2d of the second transistor T2 via contact windows 149 and 159 of the insulating layers 140 and 150.

The second terminal T2b of the second transistor T2 is electrically connected to the storage capacitor Cst. For example, in the present embodiment, the second metal layer of the semiconductor substrate 100 further includes a conductive pattern 155 overlapping with the common electrode 190 of the first metal layer. The conductive pattern 155 of the second metal layer may be at least a portion of the electrode Ast1 (shown in FIG. 1) of the storage capacitor Cst. The second terminal T2b of the second transistor T2 is connected to the conductive pattern 155 of the storage capacitor Cst. In the present embodiment, the second terminal T2b of the second transistor T2 and the conductive pattern 155 of the storage capacitor Cst may be two portions of a same second island-shaped pattern, but the invention is not limited thereto.

The first terminal T3a of the third transistor T3 is electrically connected to the capacitance control line CL. For example, in the present embodiment, the first terminal T3a of the third transistor T3 may be a portion of the capacitance control line CL overlapping with the semiconductor pattern T3d. The second terminal T3b of the third transistor T3 is electrically connected to the control terminal T2c of the second transistor T2. For example, in the present embodiment, the second terminal T3b of the third transistor T3 can be electrically connected to the control terminal T2c of the second transistor T2 via a contact window 157 of the insulating layer 150. The first terminal T3a and the second terminal T3b of the third transistor T3 are each electrically connected to two different places of the semiconductor pattern T3c. For example, the first terminal T3a of the third transistor T3 can be electrically connected to the semiconductor pattern T3d via contact windows 146 and 156 of the insulating layers 140 and 150, and the second terminal T3b of the third transistor T3 can be electrically connected to the semiconductor pattern T3d via contact windows 148, 158 of the insulating layers 140 and 150.

It is to be noted that, in the present embodiment, a vertical projection of the second transistor T2 on the base 110 is located between a vertical projection of the first transistor T1 on the base 110 and a vertical projection of the third transistor T3 on the base 110. In more detail, a vertical projection of the control terminal T2c of the second transistor T2 on the base 110 is located between a vertical projection of the second terminal T1b of the first transistor T1 on the base 110 and a vertical projection of the second terminal T3b of the third transistor T3 on the base 110.

In the present embodiment, the semiconductor substrate 100 further includes insulating layers 162 and 164 disposed on the data line DL, the capacitance control line CL, the first terminal T1a and the second terminal T1b of the first transistor T1, the first terminal T2a and the second terminal T2b of the second transistor T2, the first terminal T3a and the second terminal T3b of the third transistor T3, and the conductive pattern 155. For example, in the present embodiment, a material of the insulating layers 162 and 164 may be an inorganic material (such as: yttria, tantalum nitride, ytterbium oxynitride, or a stacked layer of at least two materials described above), an organic material or a combination of the above.

In the present embodiment, the semiconductor substrate 100 further includes a first transparent conductive layer disposed on the insulating layer 164. The first transparent conductive layer includes a common electrode 180. A portion of the common electrode 180 of the first transparent conductive layer and the common electrode 190 of the first metal layer are overlapped and electrically connected to each other. For example, the common electrode 180 of the first transparent conductive layer can be electrically connected to the common electrode 190 of the first metal layer via contact windows 162c, 164c and 153 of the insulating layers 162, 164 and 150. The common electrode 180 and the common electrode 190 that are electrically connected to each other can be regarded as the electrode Ast2 of the storage capacitor Cst (as shown in FIG. 1). In the present embodiment, a material of the first transparent conductive layer may include a metal oxide, such as: indium tin oxide, indium zinc oxide, aluminum tin oxide, aluminum zinc oxide, indium antimony zinc oxide, or other suitable oxide or a stacked layer of at least two of the above, but the invention is not limited thereto.

In the present embodiment, the semiconductor substrate 100 further includes an insulating layer 170 disposed on the common electrode 180. For example, in the present embodiment, a material of the insulating layer 170 may be an inorganic material (such as: yttrium oxide, tantalum nitride, ytterbium oxynitride, or a stacked layer of at least two materials described above), an organic material, or a combination thereof.

In the present embodiment, the semiconductor substrate 100 further includes a second transparent conductive layer disposed on the insulating layer 170. The second transparent conductive layer includes a pixel electrode 172. The pixel electrode 172 is electrically connected to the second terminal T2b of the second transistor T2. Specifically, in the present embodiment, the pixel electrode 172 can be electrically connected to the second terminals T2b of the second transistor T2 via contact windows 162a, 164a and 170a of the insulating layers 162, 164 and 170. The pixel electrode 172 overlaps with the common electrode 180. A voltage difference between the pixel electrode 172 and the common electrode 180 is used to drive a display medium such as, but not limited to, liquid crystal. The pixel electrode 172, the common electrode 180 and the display medium (not shown) may form the display medium capacitance Clc. That is, the pixel electrode 172 and the common electrode 180 may be the two electrodes Alc1 and Alc2 of the display medium capacitor Clc, respectively.

In the present embodiment, the second transparent conductive layer further includes a conductive pattern 174. The conductive pattern 174 is separated from the pixel electrode 172. The conductive pattern 174 overlaps with and is electrically connected to the second terminal T2b of the second transistor T2. The conductive pattern 174 also overlaps with the conductive pattern 155 of the second metal layer. In the present embodiment, the conductive pattern 174 is electrically connected to the second terminal T2b of the second transistor T2 and the conductive pattern 155 of the second metal layer via contact windows 162b, 164b and 170b of the insulating layers 162, 164 and 170. The conductive pattern 174 of the second transparent conductive layer and the conductive pattern 155 of the second metal layer that are electrically connected with each other can be regarded as the other electrode Ast1 of the storage capacitor Cst (as shown in FIG. 1). In general, in the present embodiment, the storage capacitor Cst may include the common electrodes 180 and 190 electrically connected to each other, the conductive patterns 174 and 155 electrically connected to each other, and the insulation layers 150, 162, 164 and 170 sandwiched between the common electrodes 180 and 190 and the conductive patterns 174 and 155.

In the present embodiment, in order to enable the storage function of the storage capacitor Cst to significantly ameliorate the aforementioned flickering problem, it is preferable that the capacitance value of the storage capacitor Cst is greater than half of the capacitance value of the display medium capacitor Clc, but the present invention is not limited thereto.

Moreover, in the present embodiment, the capacitance value of the storage capacitor Cst is greater than that of the display medium capacitance Clc, so the charging capability of the second transistor T2 for charging the storage capacitor Cst is better than the charging capability of the first transistor T1 for charging the display dielectric capacitor Clc. That is, a turn-on current (Ion) of the second transistor T2 is preferably greater than a turn-on current of the first transistor T1. For example, in the present embodiment, the semiconductor pattern T1d of the first transistor T1 has a channel width to length ratio $$\frac{W1}{L1},$$

the semiconductor pattern T2d of the second transistor T2 has a channel width to length ratio $$\frac{W2}{L2}, \text{ and } \frac{W2}{L2} > \frac{W1}{L1},$$

but the invention is not limited thereto. The amount of charge required for the third transistor T3 is small, and thus the third transistor T3 is preferably designed to prevent leakage. For example, in the present embodiment, a semiconductor pattern Td3 of the third transistor has a channel width to length ratio $$\frac{W3}{L3}, \text{ and } \frac{W3}{L3} < \left(\frac{W1}{L1}\right) / \left(\frac{W2}{L2}\right),$$

but the invention is not limited thereto.

In summary, in an embodiment of the invention, whether the second transistors are to be turned ON to charge the storage capacitors may be determined according to a grayscale value to be displayed and/or a frame rate of an image to be displayed. As such, the display panel adopting the semiconductor substrate according to an embodiment of the invention is able to ameliorate the flickering problem while achieving the power saving effect.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor substrate, comprising:
a base;
a data line, a scan line and a capacitance control line disposed on the base;
a first transistor, wherein a first terminal of the first transistor is electrically connected to the data line, and a control terminal of the first transistor is electrically connected to the scan line;
a pixel electrode electrically connected to a second terminal of the first transistor;
a second transistor, wherein a first terminal of the second transistor is electrically connected to the second terminal of the first transistor;
a storage capacitor electrically connected to a second terminal of the second transistor; and
a third transistor, wherein a first terminal of the third transistor is electrically connected to the capacitance control line, a control terminal of the third transistor is electrically connected to the scan line, and a second terminal of the third transistor is electrically connected to a control terminal of the second transistor.

2. The semiconductor substrate as recited in claim 1, wherein a vertical projection of the second transistor on the base is located between a vertical projection of the first transistor on the base and a vertical projection of the third transistor on the base.

3. The semiconductor substrate as recited in claim 1, wherein a vertical projection of the second transistor on the base is located between a vertical projection of the scan line on the base and a vertical projection of the storage capacitor on the base.

4. The semiconductor substrate as recited in claim 1, wherein the data line extends in a first direction, the scan line extends in a second direction, the control terminal of the second transistor extends in a third direction, and the third direction is intersected with the first direction and the second direction.

5. The semiconductor substrate as recited in claim 4, wherein the second direction and the third direction have an included angle θ, and 0°<θ<60°.

6. The semiconductor substrate as recited in claim 4, wherein the second transistor comprises a semiconductor pattern extending in a fourth direction, and the third direction is intersected with the first direction, the second direction and the fourth direction.

7. The semiconductor substrate as recited in claim 6, wherein the second direction and the fourth direction have an included angle Φ, and 0°<Φ<60°.

8. The semiconductor substrate as recited in claim 6, wherein the third direction and the fourth direction have an included angle α, and 0°<α≤90°.

9. The semiconductor substrate as recited in claim 1, wherein the storage capacitor comprises:
an insulating layer disposed on the second terminal of the second transistor, wherein the pixel electrode is disposed on the insulating layer; and
a conductive pattern disposed on the insulating layer, separated from the pixel electrode and electrically connected to the second terminal of the second transistor via a contact window of the insulating layer, wherein the conductive pattern overlaps with the second terminal of the second transistor.

10. The semiconductor substrate as recited in claim 1, further comprising:
a common electrode disposed on the base, wherein the common electrode overlaps with the pixel electrode to form a display medium capacitor,
wherein a capacitance value of the storage capacitor is greater than half of a capacitance value of the display medium capacitor.

11. The semiconductor substrate as recited in claim 1, wherein a semiconductor pattern of the first transistor has a channel width to length ratio $$\frac{W1}{L1},$$

a semiconductor pattern of the second transistor has a channel width to length ratio $$\frac{W2}{L2}, \text{ and } \frac{W2}{L2} > \frac{W1}{L1}.$$

12. The semiconductor substrate as recited in claim 11, wherein a semiconductor pattern of the third transistor has a channel width to length ratio $$\frac{W3}{L3}, \text{ and } \frac{W3}{L3} < \left(\frac{W1}{L1}\right) / \left(\frac{W2}{L2}\right).$$

13. A driving method, configured to drive a semiconductor substrate, wherein the semiconductor substrate comprises a plurality of pixel structures, each of the pixel structures comprises a data line, a scan line, a capacitance control line, a first transistor, a pixel electrode, a second transistor, and a storage capacitor, a first terminal of the first transistor is electrically connected to the data line, a control terminal of the first transistor is electrically connected to the scan line, a second terminal of the first transistor is electrically connected to the pixel electrode, a first terminal of the second transistor is electrically connected to the second terminal of the first transistor, a control terminal of the second transistor is electrically connected to the capacitance control line, a second terminal of the second transistor is electrically connected to the storage capacitor, and the driving method comprises:

determining an ON or OFF of at least one second transistor of at least one of the pixel structures according to at least one data signal of at least one data line of the at least one of the pixel structures.

14. The driving method as recited in claim 13, wherein the step of determining the ON or OFF of the at least one second transistor of the at least one of the pixel structures according to the at least one data signal of the at least one data line of the at least one of the pixel structures comprises:

enabling the at least one second transistor of the at least one of the pixel structures to be turned ON when determining that a grayscale value of the at least one data signal of the at least one data line of the at least one of the pixel structures is between a first preset value and a second preset value, wherein the first preset value is smaller than the second preset value.

15. The driving method as recited in claim 13, wherein the step of determining the ON or OFF of the at least one second transistor of the at least one of the pixel structures according to the at least one data signal of the at least one data line of the at least one of the pixel structures comprises:

enabling the at least one second transistor of the at least one of the pixel structures to be turned OFF when determining that a grayscale value of the at least one data signal of the at least one data line of the at least one of the pixel structures is smaller than a first preset value.

16. The driving method as recited in claim 13, wherein the step of determining the ON or OFF of the at least one second transistor of the at least one of the pixel structures according to the at least one data signal of the at least one data line of the at least one of the pixel structures comprises:

enabling the at least one second transistor of the at least one of the pixel structures to be turned OFF when determining that a grayscale value of the at least one data signal of the at least one data line of the at least one of the pixel structures is greater than a second preset value.

17. The driving method as recited in claim 13, wherein the pixel structures are configured to display a plurality of images, and the driving method further comprises:

determining the ON or OFF of the second transistors of the pixel structures according to a plurality of characteristics of the images.

18. The driving method as recited in claim 17, wherein the images comprise a first image and a second image, the pixel structures comprise a plurality of first pixel structures for displaying the first image and a plurality of second pixel structures for displaying the second image, and the steps of determining the ON or OFF of the second transistors of the pixel structures according to the characteristics of the images comprise:

enabling a plurality of second transistors of the first pixel structures to be turned OFF when determining that the first image comprises a gray screen and a white character interspersed in the gray screen; and enabling a plurality of second transistors of the second pixel structures to be turned ON when determining that the second image comprises a full gray screen.

19. The driving method as recited in claim 17, wherein the step of determining the ON or OFF of the second transistors of the pixel structures according to the characteristics of the images comprises:

determining the ON or OFF of the second transistors of the pixel structures according to a plurality of frame rates of the images.

20. The driving method as recited in claim 19, wherein the images comprise a first image and a second image, the pixel structures comprise a plurality of first pixel structures for displaying the first image and a plurality of second pixel structures for displaying the second image, and the steps of determining the ON or OFF of the second transistors of the pixel structures according to the frame rates of the images comprise:

enabling a plurality of second transistors of the first pixel structures to be turned ON when determining that a frame rate of the first image is equal to or lower than a first preset frequency; and enabling a plurality of second transistors of the second pixel structures to be turned OFF when determining that a frame rate of the of the second image is equal to or higher than a second preset frequency, wherein the first preset frequency is higher than the second preset frequency.

21. The driving method as recited in claim 13, wherein each of a plurality of data signals of the data lines of the pixel structures ranges between a high data potential Vdh and a low data potential Vdl, each of a plurality of scanning signals of the scan lines of the pixel structures ranges between a high scan potential Vgh and a low scan potential Vgl, each of a plurality of control signals of the capacitance control lines of the pixel structures ranges between a high control potential Vch and a low control potential Vcl, Vdh<Vch<Vgh, and Vgl<Vcl<Vdl.

* * * * *